US012191212B2

(12) United States Patent
Li et al.

(10) Patent No.: US 12,191,212 B2
(45) Date of Patent: Jan. 7, 2025

(54) SEMICONDUCTOR METHOD AND DEVICE

(71) Applicant: Taiwan Semiconductor Manufacturing Co., Ltd., Hsinchu (TW)

(72) Inventors: Yi-Cheng Li, Yunlin (TW); Pin-Ju Liang, Hsinchu (TW); Ta-Chun Ma, New Taipei (TW); Pei-Ren Jeng, Chu-Bei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 310 days.

(21) Appl. No.: 17/737,766

(22) Filed: May 5, 2022

(65) Prior Publication Data

US 2023/0019633 A1 Jan. 19, 2023

Related U.S. Application Data

(60) Provisional application No. 63/219,890, filed on Jul. 9, 2021.

(51) Int. Cl.
*H01L 21/8238* (2006.01)
*H01L 21/02* (2006.01)
*H01L 21/306* (2006.01)
*H01L 27/092* (2006.01)

(52) U.S. Cl.
CPC ............ *H01L 21/823878* (2013.01); *H01L 21/02532* (2013.01); *H01L 21/30604* (2013.01); *H01L 21/823821* (2013.01); *H01L 27/0924* (2013.01)

(58) Field of Classification Search
CPC ....... H01L 21/823878; H01L 21/02532; H01L 21/30604; H01L 21/823821; H01L 27/0924; H01L 29/7851; H01L 21/823807; H01L 29/1054; H01L 29/66795
See application file for complete search history.

(56) References Cited

U.S. PATENT DOCUMENTS

| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |

(Continued)

FOREIGN PATENT DOCUMENTS

TW 202008433 A 2/2020

*Primary Examiner* — Karen Kusumakar
*Assistant Examiner* — Adam S Bowen
(74) *Attorney, Agent, or Firm* — Slater Matsil, LLP

(57) ABSTRACT

A method includes forming a fin extending from a substrate; depositing a liner over a top surface and sidewalls of the fin, where the minimum thickness of the liner is dependent on selected according to a first germanium concentration of the fin; forming a shallow trench isolation (STI) region adjacent the fin; removing a first portion of the liner on sidewalls of the fin, the first portion of the liner being above a topmost surface of the STI region; and forming a gate stack on sidewalls and a top surface of the fin, where the gate stack is in physical contact with the liner.

20 Claims, 36 Drawing Sheets

(56) References Cited

U.S. PATENT DOCUMENTS

| | | | |
|---|---|---|---|
| 9,607,878 B2 * | 3/2017 | Chen | ................ H01L 21/76224 |
| 9,608,116 B2 | 3/2017 | Ching et al. | |
| 2020/0075729 A1 * | 3/2020 | Yen | .................... H01L 21/0217 |
| 2022/0302116 A1 | 9/2022 | Wang et al. | |

* cited by examiner

SEMICONDUCTOR METHOD AND DEVICE

PRIORITY CLAIM AND CROSS-REFERENCE

This patent application claims priority to U.S. Provisional Application No. 63/219,890, filed on Jul. 9, 2021 and entitled "Suppression of Oxidation with Thick Si Liner for High Germanium Concentration of Silicon Germanium Fin," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

FinFETs are increasingly employed in the manufacture of integrated circuits, owing to the small size and high performance of the FinFET transistor. Fully strained channels further improve FinFET performance, but fully strained channel architectures creates their own shortcomings to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 8A are cross-sectional views of intermediate stages in the manufacturing of FinFETs, in accordance with some embodiments.

DETAILED DESCRIPTION

Figure 1:
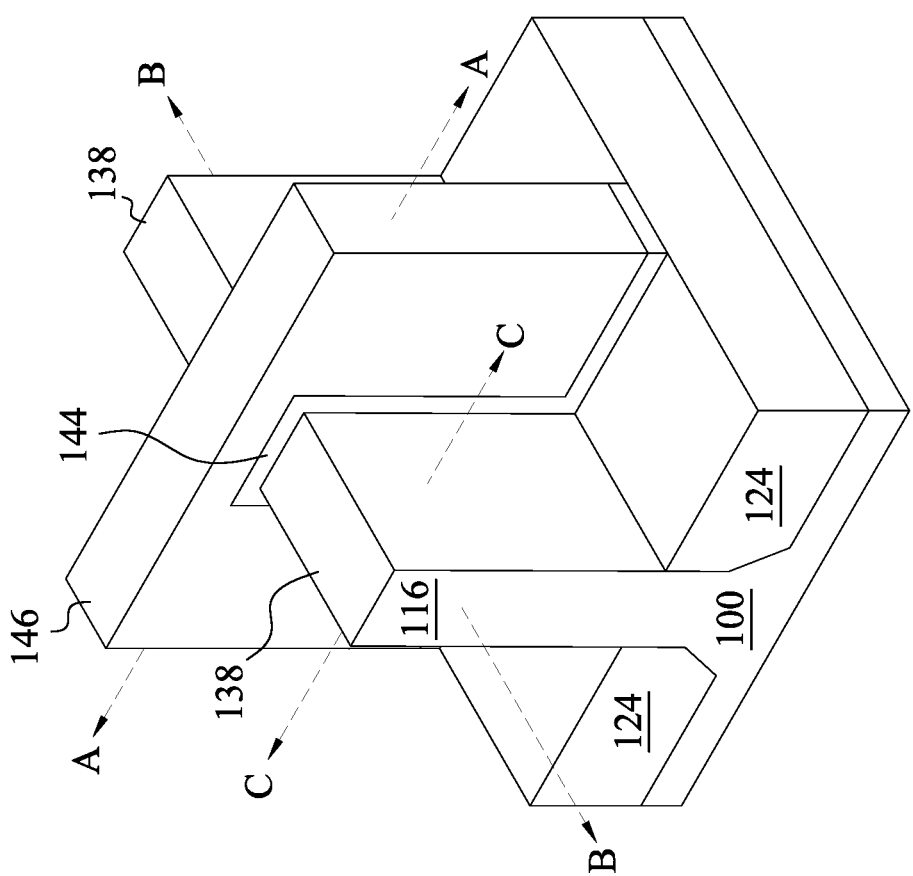
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include the formation of a silicon liner over sidewalls and a top surface of a semiconductor fin prior to forming an insulation material over the semiconductor fin and the silicon liner. The semiconductor fin is formed at least partially of silicon germanium. An anneal process is then performed on the insulation material, and the insulation material is recessed to form shallow trench isolation (STI) regions that surround the semiconductor fin. A minimum thickness of the silicon liner is directly proportional to the atomic percentage concentration of germanium in the semiconductor fin. Advantageous features of embodiments disclosed herein include the suppression of oxidation of the semiconductor fin during the anneal process. This allows the semiconductor fin to be formed having a higher atomic percentage concentration of germanium without significant oxidation effects and improved line end roughness (LER) of the semiconductor fin. Accordingly, device performance is improved due to the increase in carrier mobility as a result of the higher percentage concentration of germanium.

FIG. 1 illustrates an example of a FinFET in a three-dimensional view for reference, in accordance with some embodiments. The FinFET comprises a semiconductor fin 116 on a substrate 100 (e.g., a semiconductor substrate). Isolation regions 124 are disposed in the substrate 100, and the semiconductor fin 116 protrudes above and from between neighboring isolation regions 124. Although the isolation regions 124 are described and illustrated as being separate from the substrate 100, as used herein the term "substrate" may be used to refer to just the semiconductor substrate or a semiconductor substrate inclusive of the isolation regions 124. A gate dielectric layer 144 is along sidewalls and over a top surface of the semiconductor fin 116, and a gate electrode 146 is over the gate dielectric layer 144. Source/drain regions 138 are disposed in opposite sides of the semiconductor fin 116 with respect to the gate dielectric layer 144 and gate electrode 146. FIG. 1 further illustrates reference cross-sections that are used in later figures. Cross-section A-A is along a longitudinal axis of the gate electrode 146 and in a direction, for example, perpendicular to the direction of current flow between the source/drain regions 138 of the FinFET. Cross-section B-B is perpendicular to the cross-section A-A and is along a longitudinal axis of the semiconductor fin 116 and in a direction of, for example, a current flow between the source/drain regions 138 of the FinFET. Cross-section C-C is parallel to the cross-section A-A and extends through one of the source/drain regions 138 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2, 3, 4, 5, 6, 7, 8A, 9, 10, 11, 12A, 12B, 13A, 13B, 14A, 14B, 15A, 15B, 16A, 16B, 16C, 16D, 17A, 17B, 18A, 18B, 19A, 19B, 20A, 20B, 21A, 21B, 22A and 22B are cross-sectional views of intermediate stages in the manufacturing of FinFETs, in accordance with some embodiments. FIGS. 2, 3, 4, 5, 6, 7, 8A, 9, 10, 11, 12A, and 12B illustrate reference cross-section A-A illustrated in FIG. 1, except for illustrating multiple fins/FinFETs. In FIGS. 13A through 22B, figures ending with an "A" designation are illustrated along reference cross-section A-A illustrated in FIG. 1, except for illustrating multiple fins/FinFETs, and figures ending with a "B" designation are illustrated along a similar cross-section B-B illustrated in FIG. 1. FIGS. 16C and 16D are illustrated along reference cross-section C-C illustrated in FIG. 1.

Figure 2:
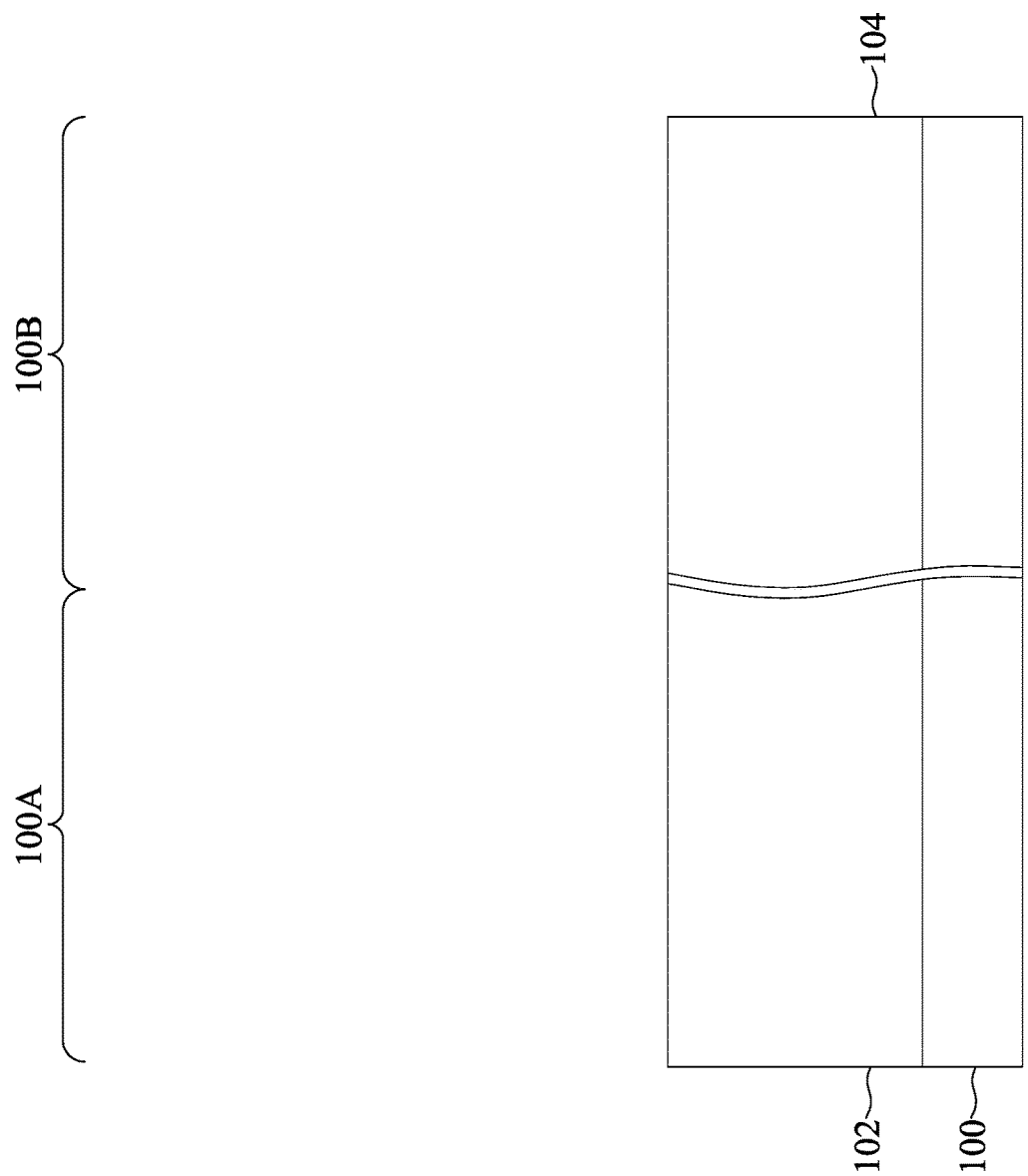

In FIG. 2, a substrate 100 having an n-well region 102 and a p-well region 104 formed therein is provided. The substrate 100 may be a semiconductor substrate, such as a bulk semiconductor, a semiconductor-on-insulator (SOI) substrate, or the like, which may be doped (e.g., with a p-type dopant or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has a first region 100A and a second region 100B. The first region 100A may be for forming p-type devices, such as PMOS transistors, e.g., p-type FinFETs. The second region 100B may be for forming n-type devices, such as NMOS transistors, e.g., n-type FinFETs. The first region 100A may be physically separated from the second region 100B by a divider, and any number of device features (e.g., other active devices, doped regions, isolation structures, etc.) may be disposed between the first region 100A and the second region 100B.

The n-well region 102 may be formed in the substrate 100 by covering the p-well region 104 with a mask (such as a photoresist, an oxide, or the like) and performing an ion implantation process on the n-well region 102. N-type dopants, such as arsenic ions, may be implanted into the n-well region 102. The p-well region 104 may be formed in the substrate 100 by covering the n-well region 102 with a mask (such as a photoresist, an oxide, or the like) and performing an ion implantation process on the p-well region 104. P-type dopants, such as boron ions, may be implanted into the p-well region 104. In some embodiments, the n-well region 102 may comprise n-type doped silicon and the p-well region 104 may comprise p-type doped silicon.

Figure 3:
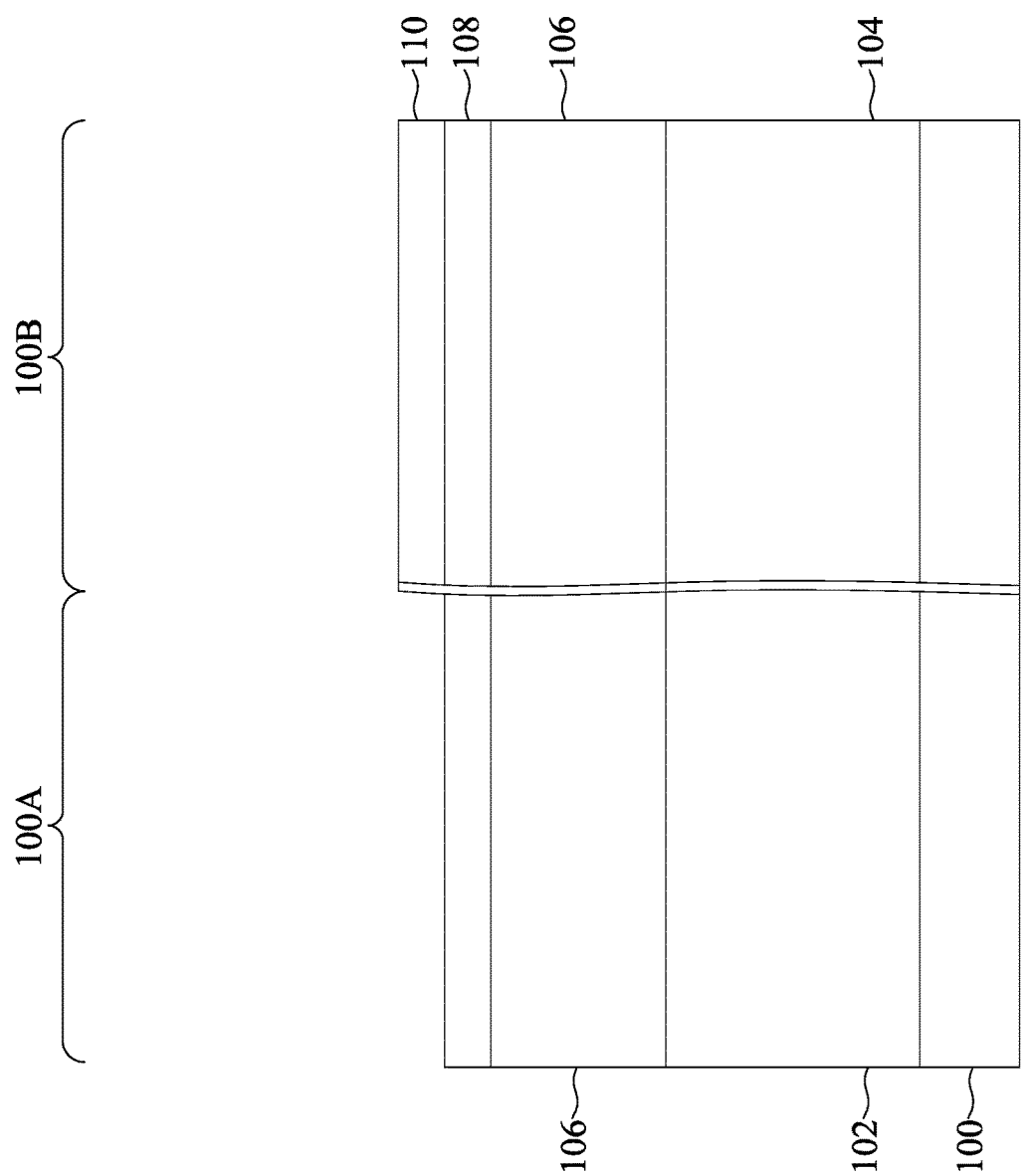

In FIG. 3, a first epitaxial layer 106 is formed over the n-well region 102 and the p-well region 104, a mask layer 108 is formed over the first epitaxial layer 106, and a patterned photoresist 110 is formed on the mask layer 108. The first epitaxial layer 106 may be a channel in a subsequently formed NMOS device and may be used to reduce dislocation defects in a subsequently formed second epitaxial layer 114. The first epitaxial layer 106 may be formed by a process such as epitaxial growth or the like. The first epitaxial layer 106 may comprise a material such as silicon or the like. The first epitaxial layer 106 may have a lattice constant similar to or the same as the lattice constants of the n-well region 102 and the p-well region 104. As explained in greater detail below, the first epitaxial layer 106 will be patterned to form a fin in the second region 100B (e.g., for NMOS devices) and will be used as a seed layer to form another epitaxial layer in the first region 100A (e.g., for PMOS devices). In some embodiments, the first epitaxial layer 106 has a thickness that is in a range from 35 nm to 75 nm.

The mask layer 108 may be formed by a process such as chemical vapor deposition (CVD), atomic layer deposition (ALD), or the like. The mask layer 108 may comprise a material such as silicon dioxide, silicon nitride, or the like. The patterned photoresist 110 may be deposited using a spin-on technique or the like and patterned by exposing the photoresist material to a patterned energy source (e.g., a patterned light source, an electron beam (e-beam) source, or the like) and exposing the patterned photoresist material to a developer solution. The developer solution may remove a portion of the photoresist material such that at least a portion of the mask layer 108 is exposed. As illustrated in FIG. 3, the patterned photoresist 110 may be patterned such that the patterned photoresist 110 extends over the p-well region 104 without extending over the n-well region 102. However, in various other embodiments, the patterned photoresist 110 may overlap at least a portion of the n-well region 102 or may not completely cover the p-well region 104.

Figure 4:
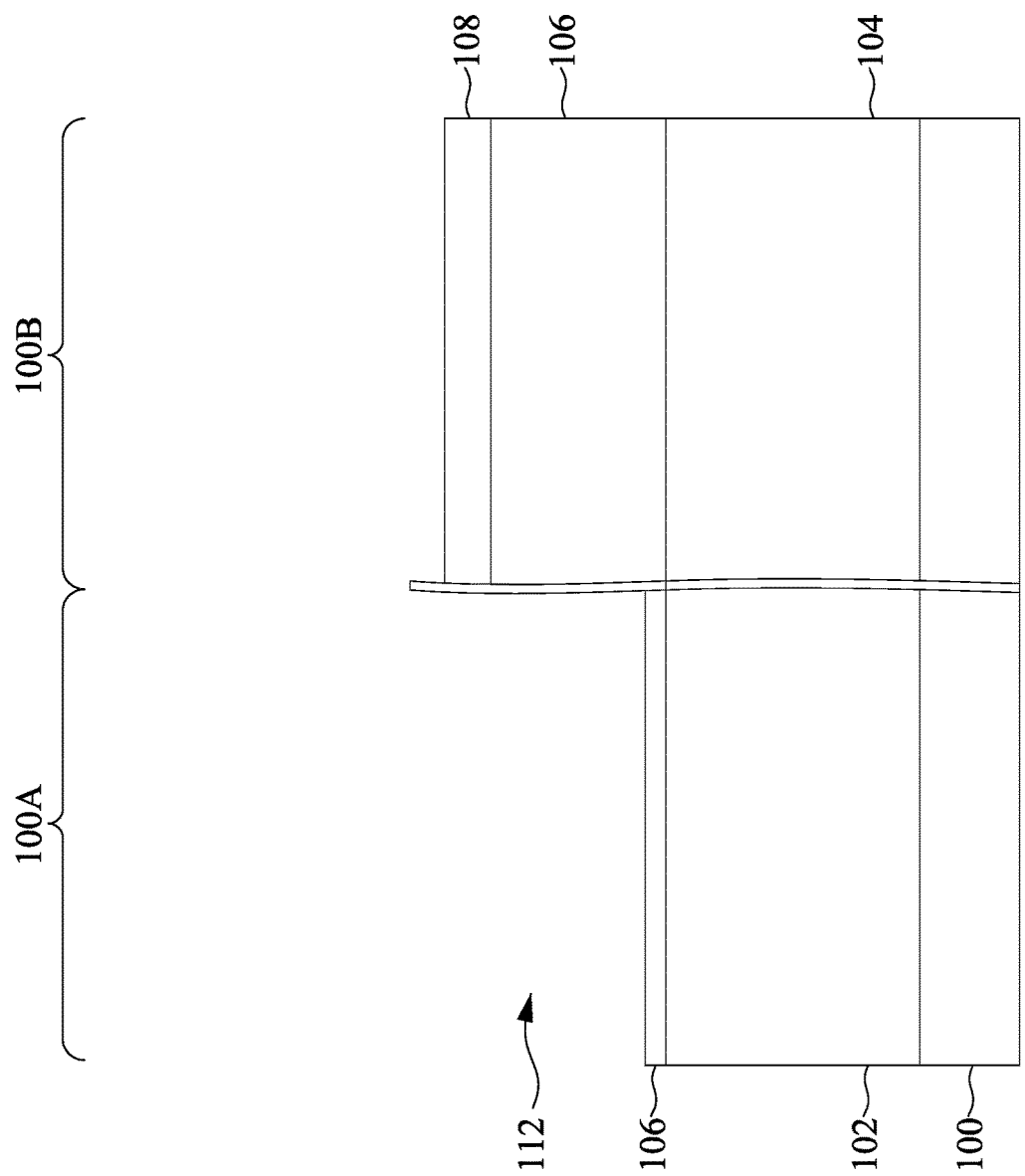

In FIG. 4, the mask layer 108 is etched using the patterned photoresist 110 as a mask and the first epitaxial layer 106 is etched using the mask layer 108 as a mask to form a first opening 112. The mask layer 108 and the first epitaxial layer 106 may be etched by suitable etch processes, such as anisotropic etch processes. In some embodiments, the mask layer 108 and the first epitaxial layer 106 may be etched by dry etch processes such as reactive-ion etching (RIE), neutral-beam etching (NBE), combinations thereof, or the like. After the mask layer 108 is etched, the patterned photoresist 110 may be removed using suitable photoresist stripping techniques, such as chemical solvent cleaning, plasma ashing, dry stripping and/or the like. The patterned photoresist 110 may be removed before or after etching the first epitaxial layer 106. As illustrated in FIG. 4, the first opening 112 may be formed over the n-well region 102, without extending over the p-well region 104. However, in some embodiments, the first opening 112 may extend over at least a portion of the p-well region 104. As illustrated in FIG. 4, at least a portion of the first epitaxial layer 106 may remain below the first opening 112. The portion of the first epitaxial layer 106 remaining over the n-well region 102 may be used to grow a second epitaxial layer 114, discussed below in reference to FIG. 5. In some embodiments, the portion of the first epitaxial layer 106 remaining may have a thickness that is in a range from 10 nm to 30 nm after etching the first opening 112. In some embodiments, a depth of the first opening 112 may be in a range from 30 nm to 65 nm.

Figure 5:
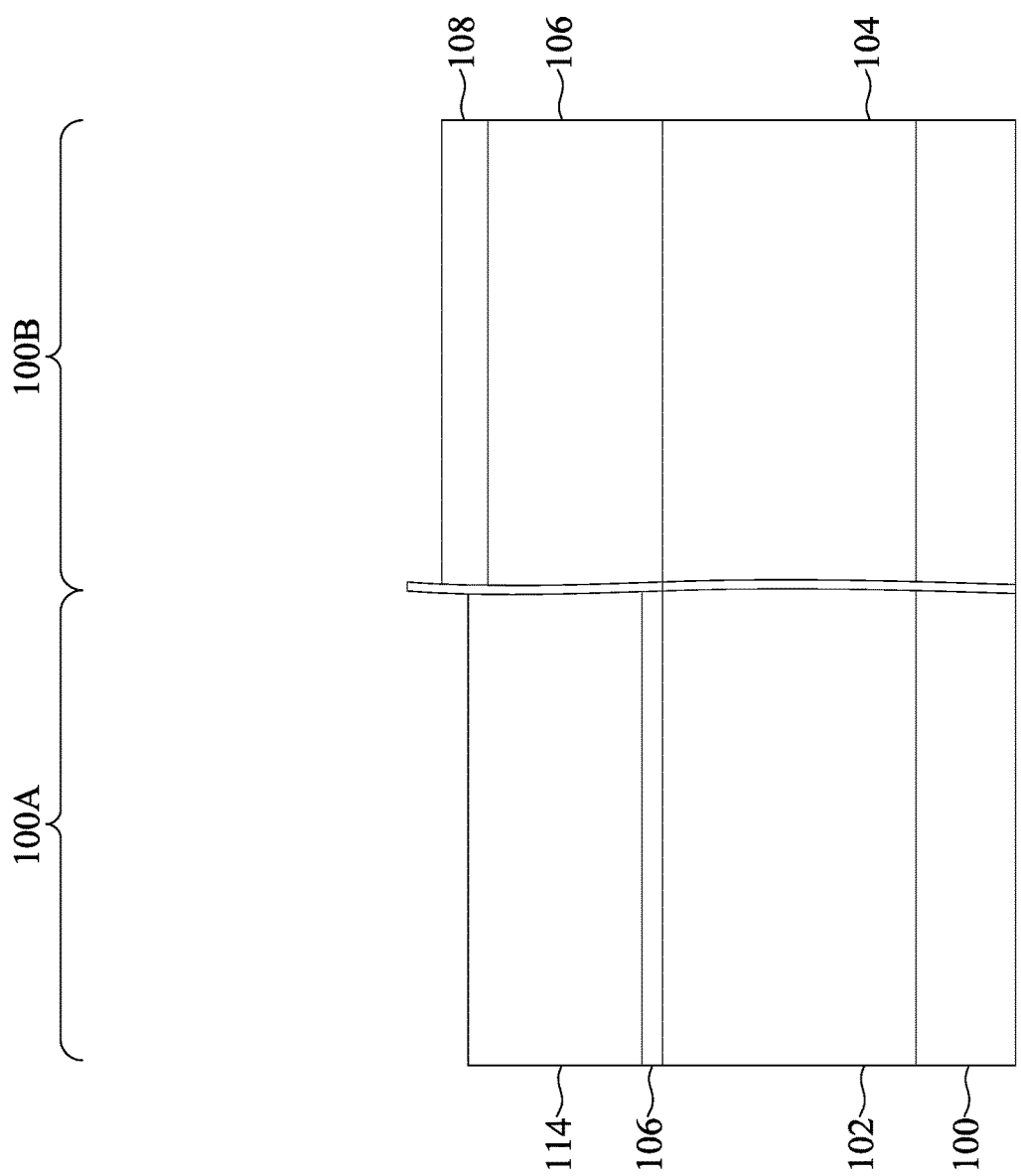

In FIG. 5, a second epitaxial layer 114 is formed in the first opening 112. The second epitaxial layer 114 may be formed by a process such as epitaxial growth or the like. The second epitaxial layer 114 may comprise a material such as silicon germanium (SiGe), or the like. In embodiments in which the first region 100A is a PMOS region, the second epitaxial layer 114 may comprise a material having a greater lattice constant than the lattice constant of the first epitaxial layer 106. For example, in some embodiments, the second epitaxial layer 114 may comprise SiGe. SiGe comprises a lower bandgap than Si, allowing for greater hole mobility for subsequently formed PMOS devices. In an embodiment, the second epitaxial layer 114 may have an atomic percentage concentration of germanium that is in a range from 20 percent to 80 percent.

As illustrated in FIG. 5, the second epitaxial layer 114 may fill the first opening 112 such that a top surface of the second epitaxial layer 114 is disposed above a top surface of the first epitaxial layer 106. The second epitaxial layer 114 may be formed to a thickness such that a subsequent planarization process of the first epitaxial layer 106 and the second epitaxial layer 114 will create a planar surface. In some embodiments, at least a portion of the second epitaxial layer 114 may extend over the mask layer 108.

Figure 6:
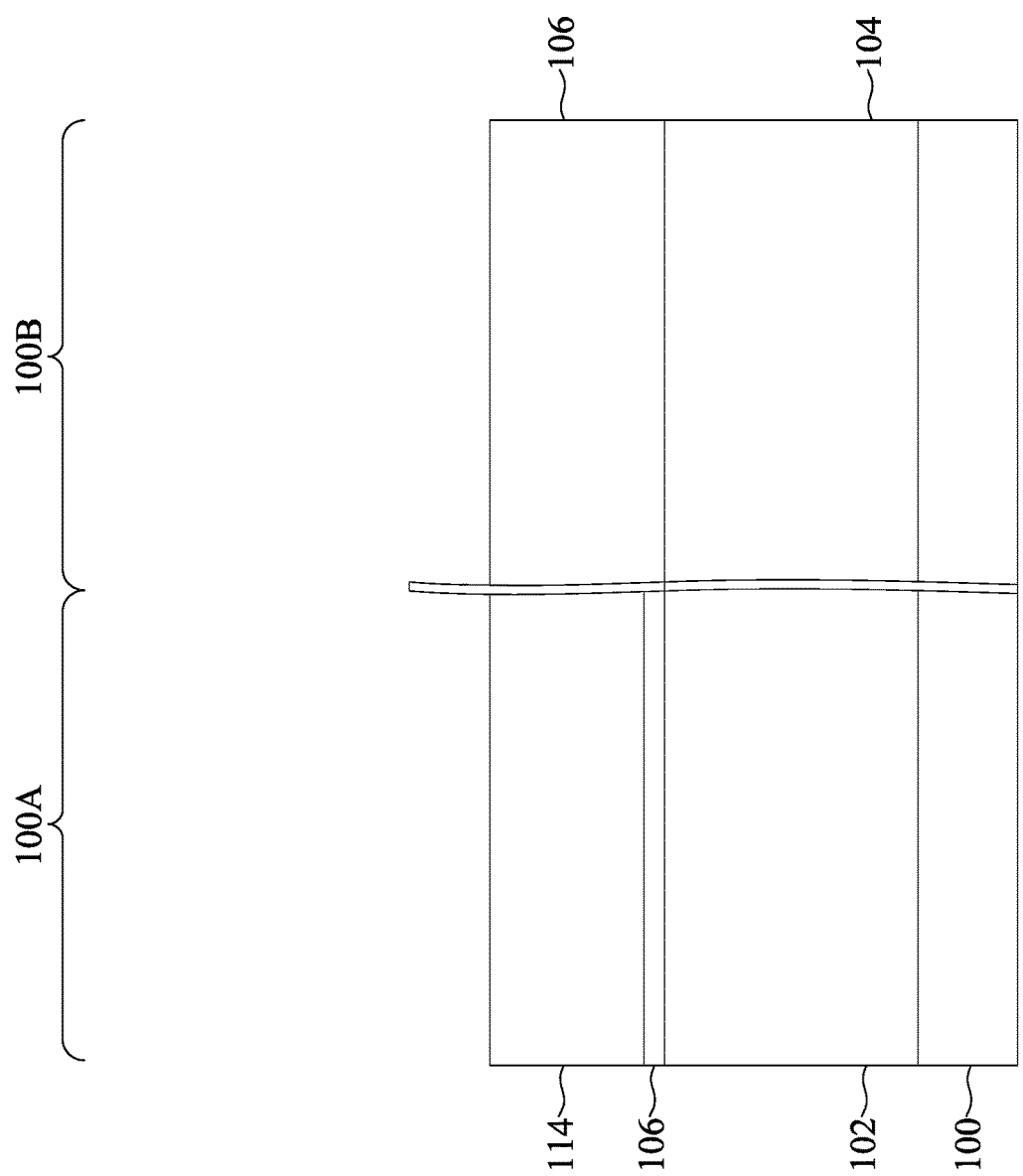

In FIG. 6, the mask layer 108 is removed and a planarization process is performed on the first epitaxial layer 106 and the second epitaxial layer 114. The mask layer 108 may be removed using a suitable etch process, such as a wet etch process (e.g., dilute hydrofluoric (dHF) acid, or the like). The first epitaxial layer 106 and the second epitaxial layer 114 may be planarized by any suitable planarization process, such as a chemical mechanical polish (CMP), an etch-back process, combinations thereof, or the like. As illustrated in FIG. 6, following the planarization process, top surfaces of the first epitaxial layer 106 may be level with top surfaces of the second epitaxial layer 114. In some embodiments, following the planarization process, the second epitaxial layer 114 may have a thickness in a range from 35 nm to 65 nm, and the first epitaxial layer 106 in the second region 100B may have a thickness in a range from 45 nm to 70 nm.

Figure 7:
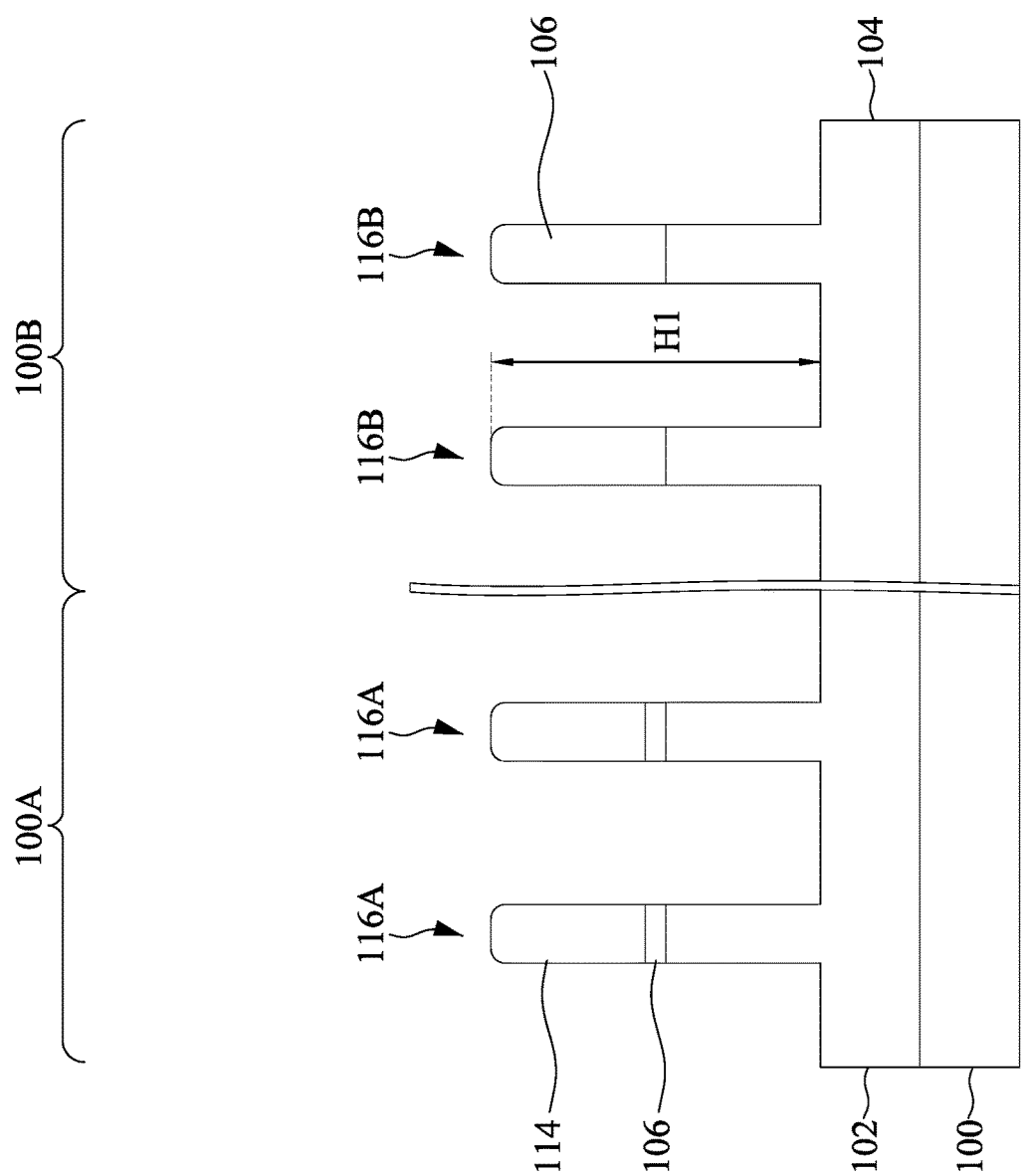

In FIG. 7, the second epitaxial layer 114, the first epitaxial layer 106, the n-well region 102, and the p-well region 104 are etched to form first semiconductor fins 116A in the first region 100A and second semiconductor fins 116B in the second region 100B. In some embodiments, the first semiconductor fins 116A and the second semiconductor fins 116B may be formed by etching trenches in the second epitaxial layer 114, the first epitaxial layer 106, the n-well region 102, and the p-well region 104. The etching may be one or more of any acceptable etch process, such as a reactive ion etch (RIE), a neutral beam etch (NBE), the like, or a combination thereof. The etching may be anisotropic. Although the first semiconductor fins 116A and the second semiconductor fins 116B are illustrated as having rounded corners and linear edges, the first semiconductor fins 116A and the second semiconductor fins 116B may have any other suitable shape, such as having tapered sidewalls. In some embodiments, the first semiconductor fins 116A and the second semiconductor fins 116B may have a height H1 that is in a range from 70 nm to 130 nm.

The first semiconductor fins 116A and the second semiconductor fins 116B may be patterned by any suitable method. For example, the first semiconductor fins 116A and the second semiconductor fins 116B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Although a double-patterning or multi-patterning process is not separately illustrated, in one embodiment, the double-patterning or multi-patterning process may include forming a sacrificial layer over a substrate. The sacrificial layer is patterned using a photolithography process. Spacers are formed alongside the sacrificial layer using a self-aligned process. The sacrificial layer is then removed and the remaining spacers are used to pattern first semiconductor fins 116A and second semiconductor fins 116B.

Figure 8A:
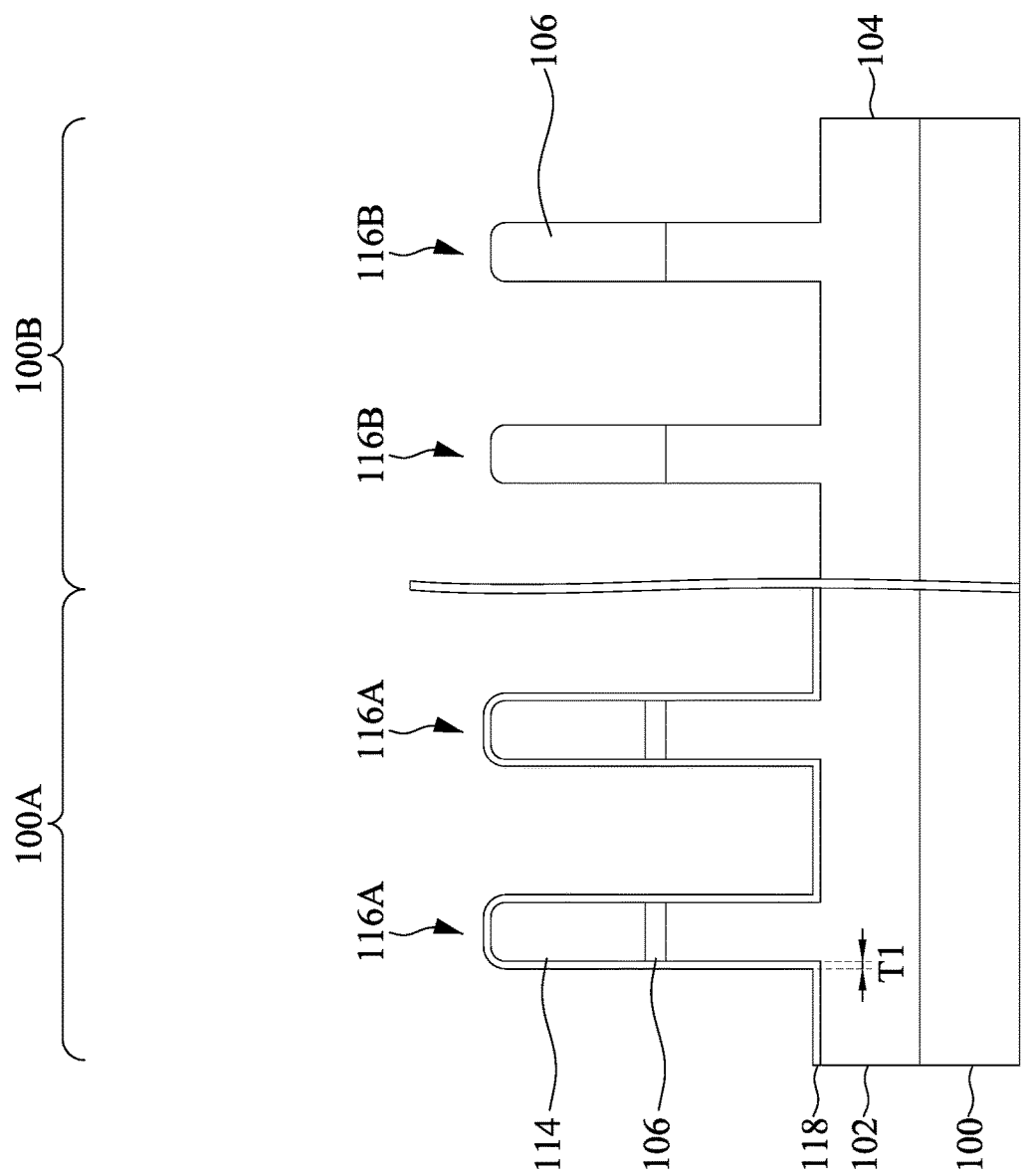
Figure 8B:
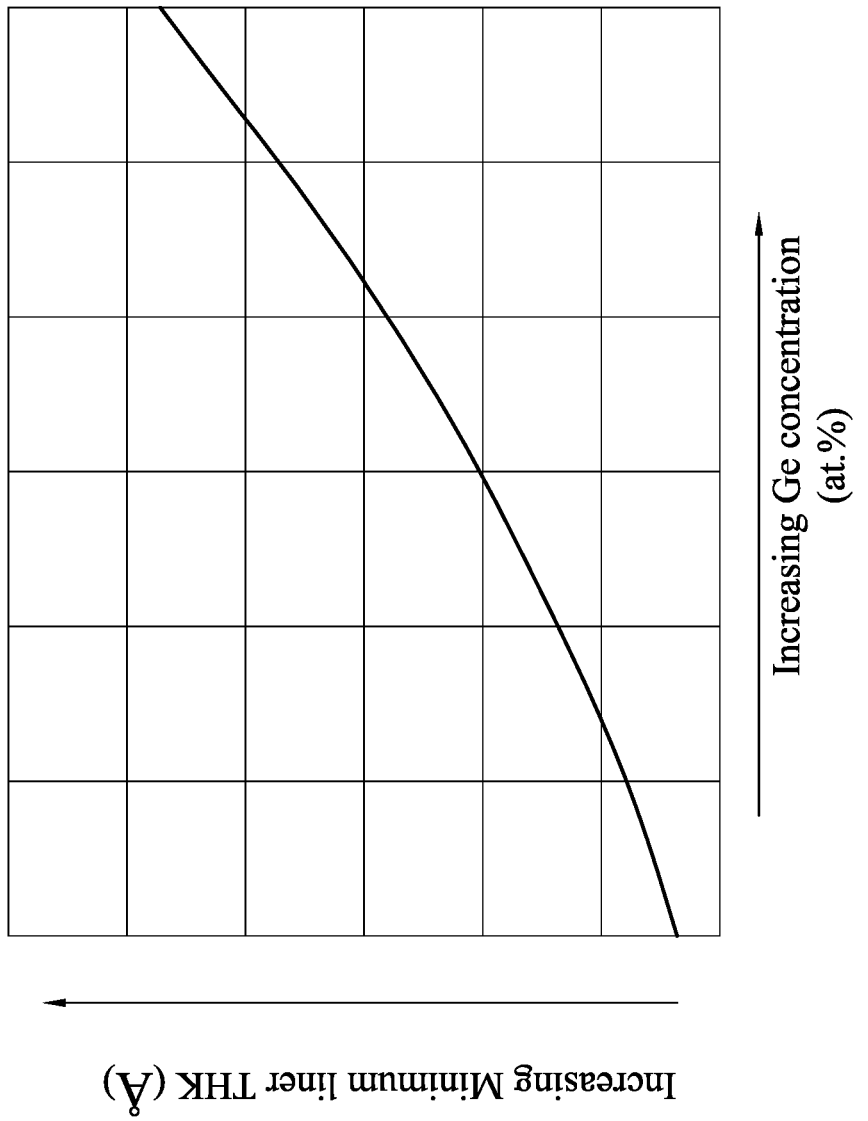
FIG. 8B shows a minimum thickness of a semiconductor liner versus germanium concentration trace, in accordance with some embodiments.

In FIG. 8A, a liner 118 may be formed over the n-well region 102, and top surfaces and sidewalls of the first semiconductor fins 116A in the first region 100A. The liner may comprise silicon, or the like. In an embodiment, at the thinnest point of the liner 118, a minimum thickness T1 of the liner 118 may be in a range from 0.5 nm to 5 nm. To form the liner 118, a photoresist may be formed and patterned to extend over the second semiconductor fins 116B and the p-well region 104 in the second region 100B, without extending over the first region 100A. The liner 118 may be deposited at a process temperature that is in a range from 350° C. to 500° C., and at a process pressure that is in a range from 0.5 mtorr to 3 mtorr, using CVD, furnace CVD, ALD, epitaxial growth, or the like. Precursors that may be used for the deposition of the liner 118 include silane ($SiH_4$), disilane ($Si_2H_6$), a combination thereof, or the like. The liner 118 may be formed as a conformal layer, wherein the liner 118 may have a variation in thickness that may be up to 20 percent that of the minimum thickness T1 at the thinnest point of the liner 118. After the deposition of the liner 118, the photoresist may be removed using suitable photoresist stripping techniques, such as chemical solvent cleaning, plasma ashing, dry stripping and/or the like. FIG. 8B shows a minimum thickness T1 versus germanium concentration of the second epitaxial layer 114 trace. The minimum thickness T1 of the liner 118 is selected depending on the germanium concentration of the second epitaxial layer 114, such that the minimum thickness T1 increases from 0.5 nm at an atomic germanium concentration of 20 percent to 5 nm at an atomic germanium concentration of 80 percent.

Figure 9:
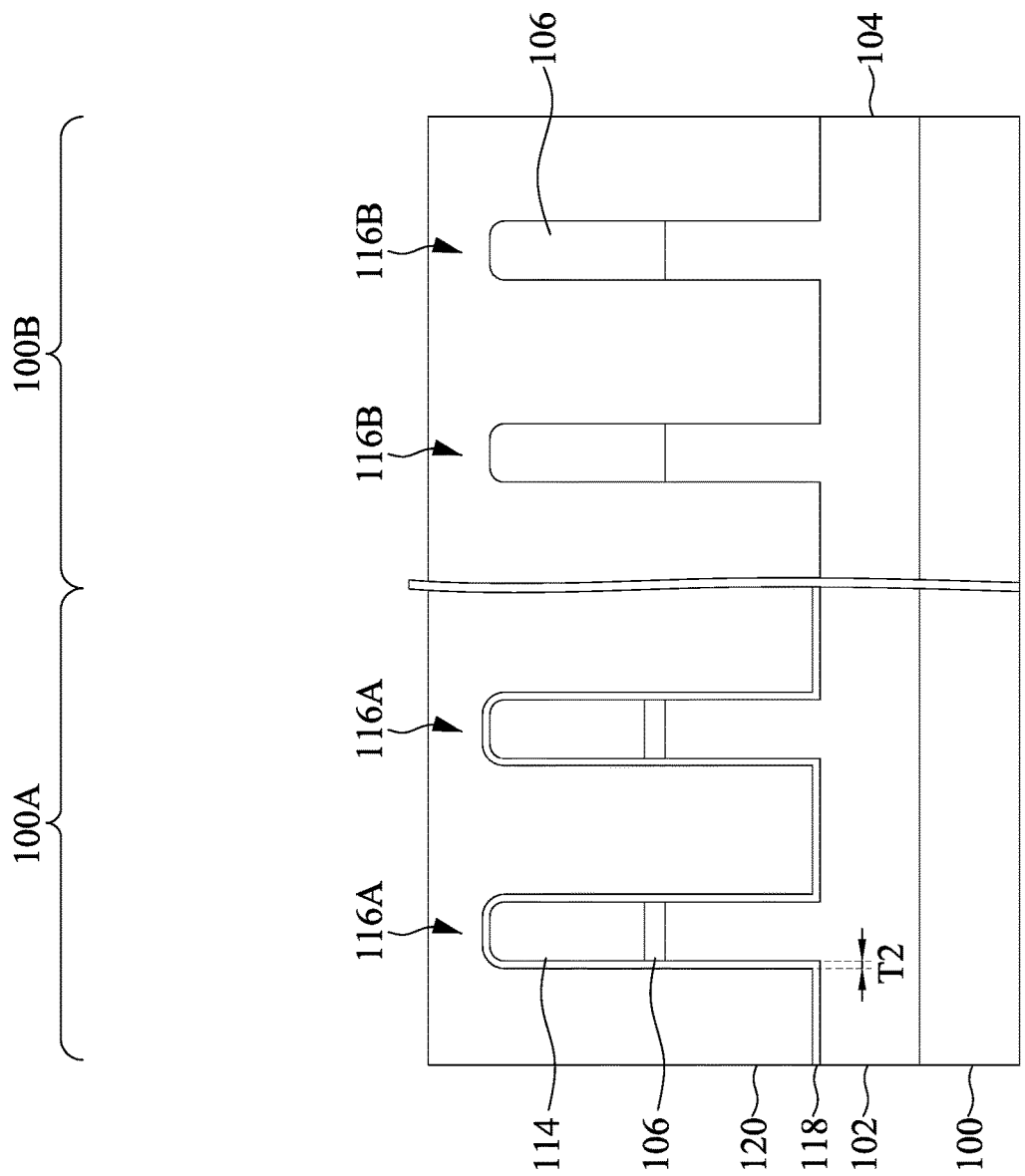
FIGS. 9, through 12B are cross-sectional views of intermediate stages in the manufacturing of FinFETs, in accordance with some embodiments.

In FIG. 9, a dielectric material 120 is formed over the first semiconductor fins 116A, the liner 118 and the n-well region 102 in the first region 100A, and the second semiconductor fins 116B, and the p-well region 104 in the second region 100B, filling openings between the first semiconductor fins 116A and the second semiconductor fins 116B. The dielectric material 120 may overfill the openings between the first semiconductor fins 116A and the second semiconductor fins 116B, such that a portion of the dielectric material 120 extends above top surfaces of the first semiconductor fins 116A and the second semiconductor fins 116B. In some embodiments, the dielectric material 120 may comprise silicon oxide, silicon carbide, silicon nitride, the like, or a combination thereof, and may be formed using flowable chemical vapor deposition (FCVD), spin-on coating, CVD, ALD, high-density plasma chemical vapor deposition (HDPCVD), low pressure chemical vapor deposition (LPCVD), the like, or a combination thereof. After the dielectric material 120 is deposited, an anneal/curing step may be performed, which may convert the flowable dielectric material 120 into a solid dielectric material. In an embodiment where an anneal step is carried out, the anneal step may be performed at a process temperature that is in a range from 400° C. to 700° C. During the anneal step, a portion of the liner 118 is oxidized and consumed by dielectric material 120, resulting in a reduction of the thickness of the liner 118 to a thickness T2. In an embodiment, the thickness T2 may be lower than the minimum thickness T1 by a value that is in a range from 0.3 nm to 2 nm.

Figure 10:
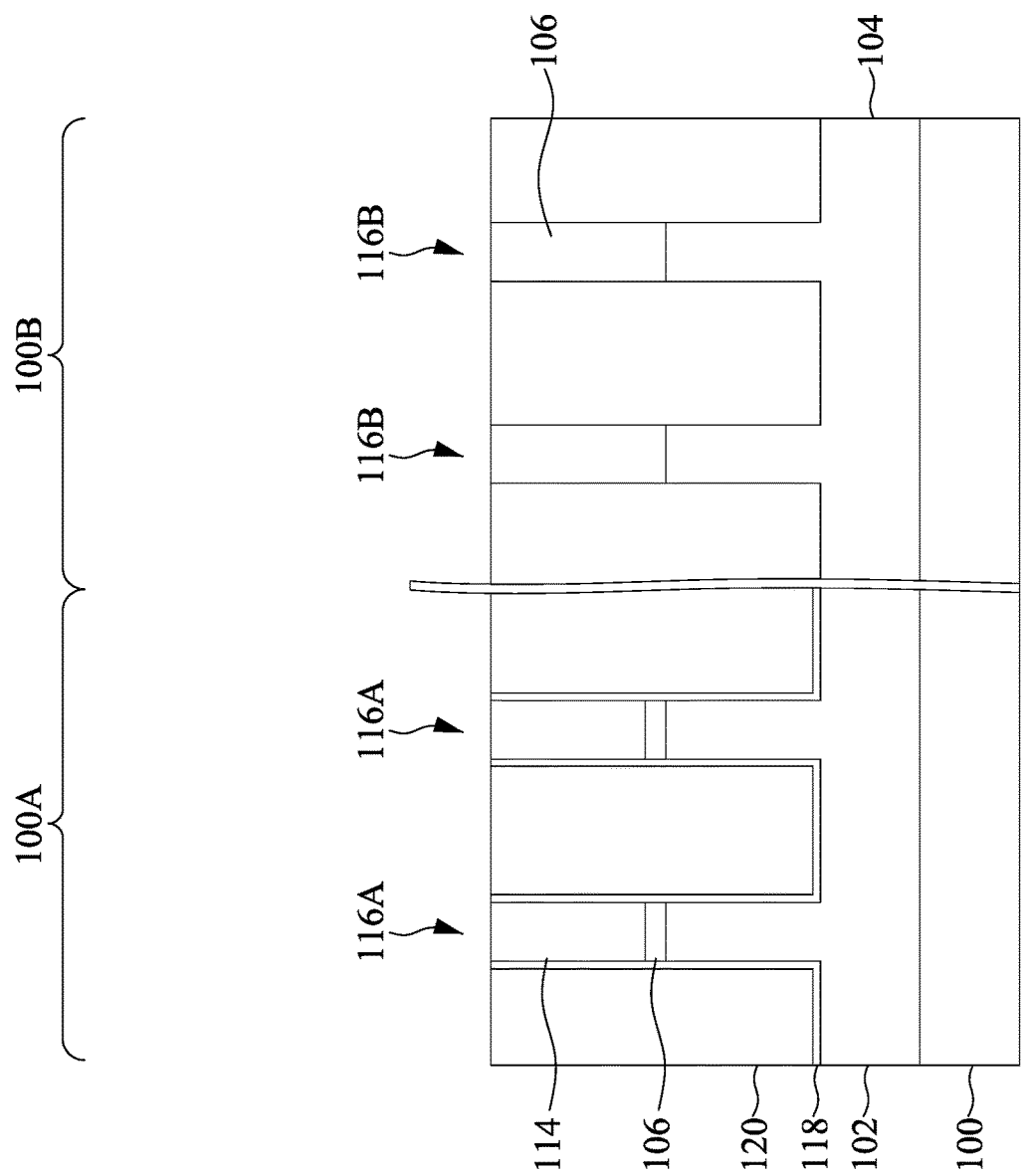

In FIG. 10, a planarization process is applied to the dielectric material 120. In some embodiments, the planarization process includes a chemical mechanical polish (CMP), an etch-back process, combinations thereof, or the like. As illustrated in FIG. 10, the planarization process may expose top surfaces of the first semiconductor fins 116A and the second semiconductor fins 116B. Portions of the first semiconductor fins 116A and the second semiconductor fins 116B may also be planarized by the planarization process. Top surfaces of the first semiconductor fins 116A, the second semiconductor fins 116B, and the dielectric material 120 are level after the planarization process is complete.

Figure 11:
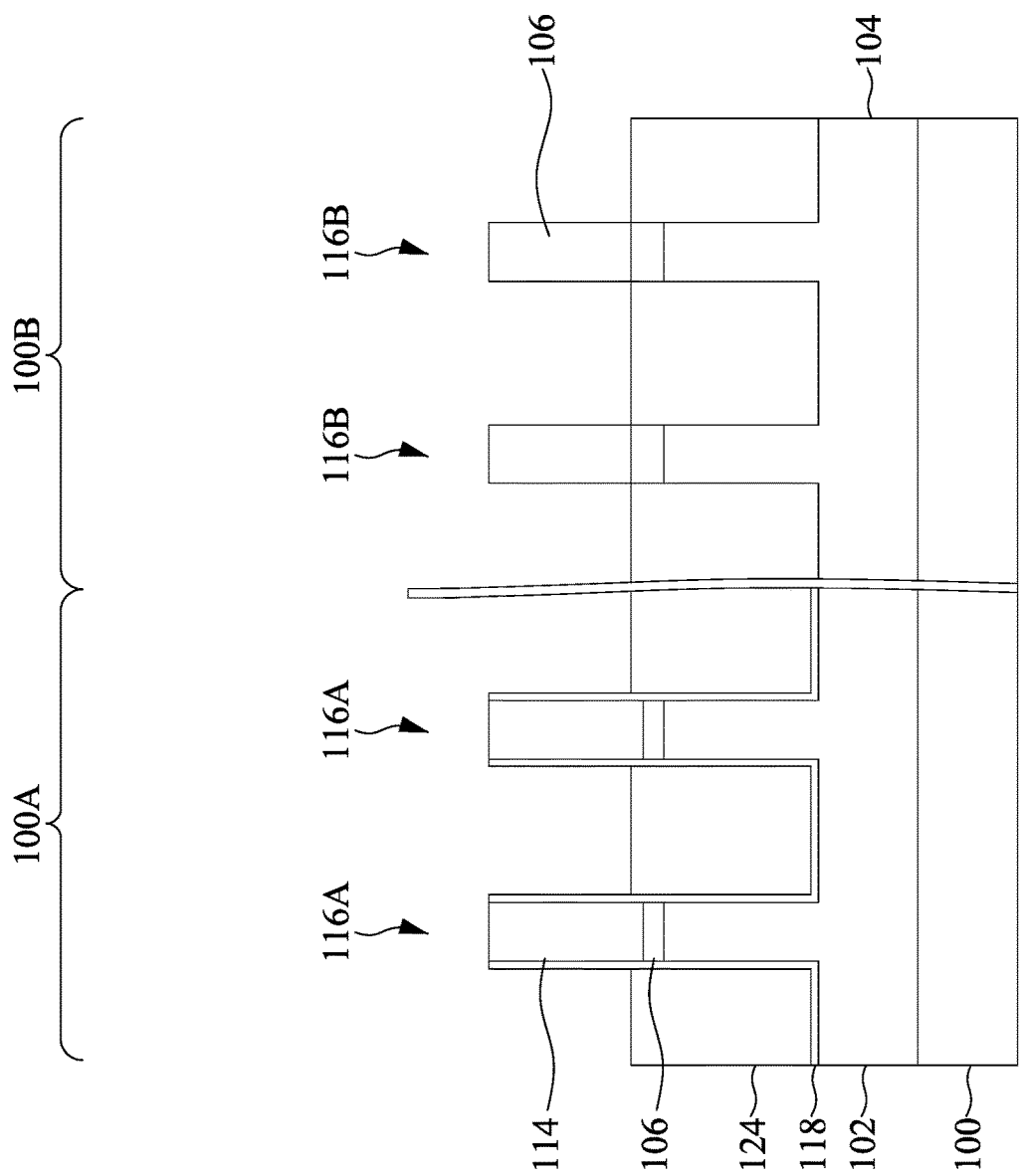

In FIG. 11, the dielectric material 120 is recessed to form shallow trench isolation (STI) regions 124. The dielectric material 120 is recessed such that portions of the first semiconductor fins 116A in the first region 100A that comprise the second epitaxial layer 114, and portions of the second semiconductor fins 116B that comprise the first epitaxial layer 106 in the second region 100B protrude from between neighboring STI regions 124. The STI regions 124 may be recessed using an acceptable etching process, such as one that is selective to the material of the STI regions 124. For example, a chemical oxide removal using a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), or dilute hydrofluoric (dHF) acid may be used.

Figure 12A:
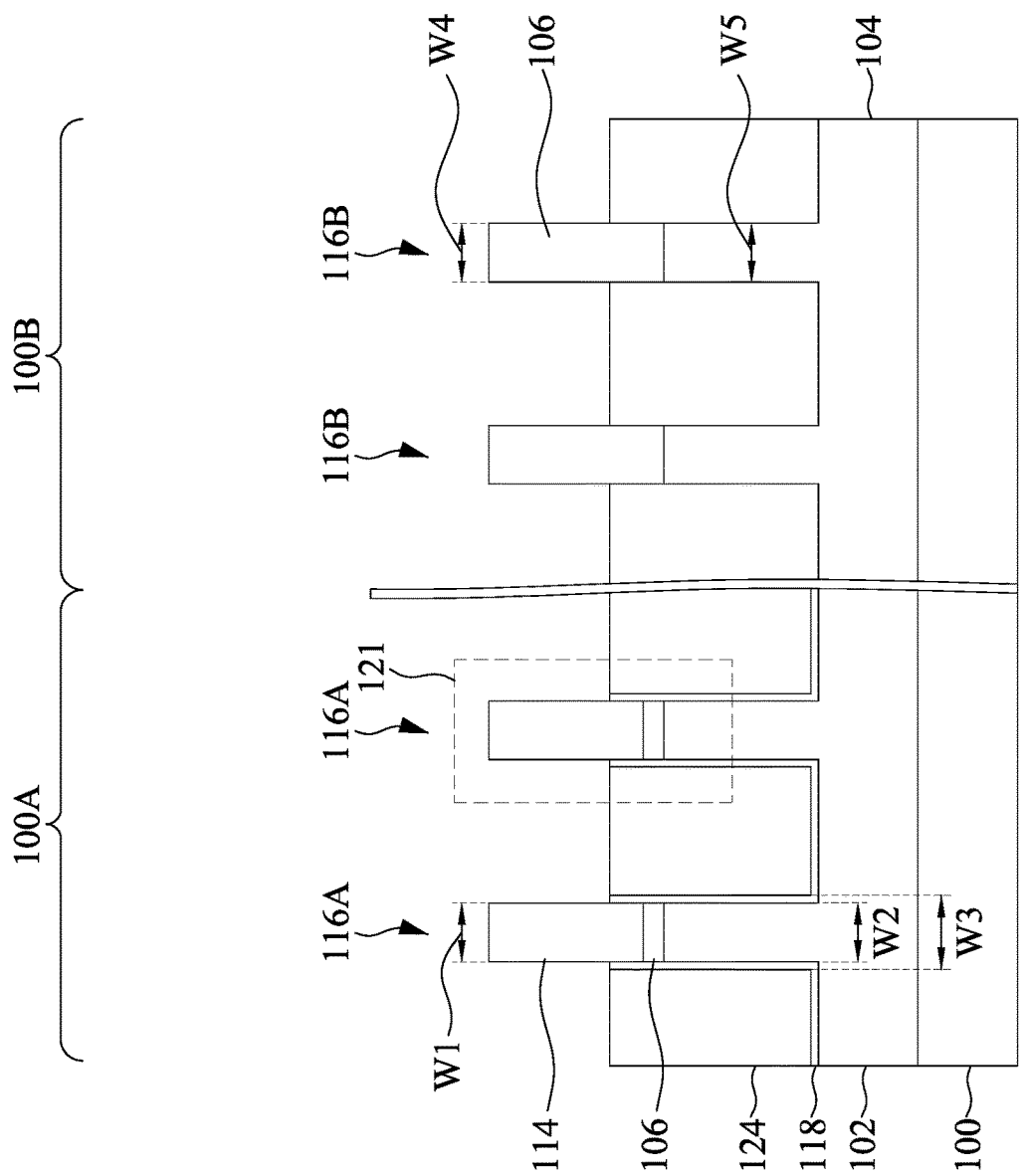
FIG. 12C shows a minimum fin width versus germanium concentration trace, in accordance with some embodiments.
Figure 12B:
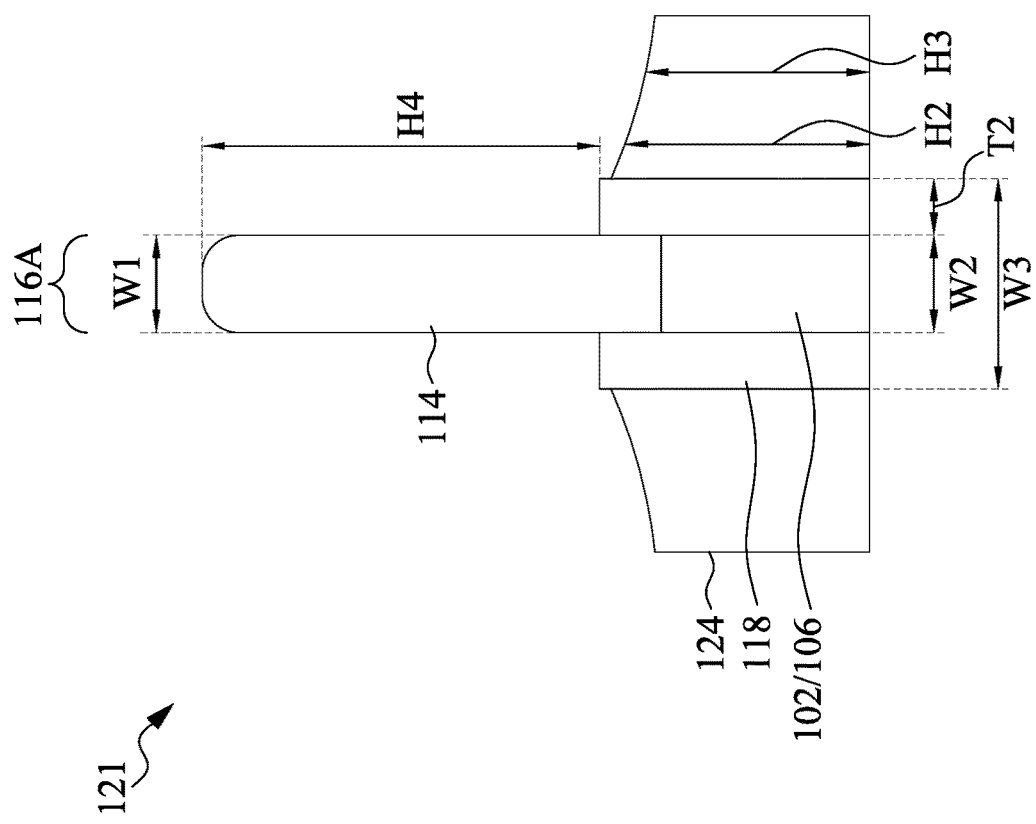

In FIGS. 12A and 12B, top portions of the liner 118 on top surfaces and sidewalls of the first semiconductor fins 116A that are above the STI regions 124 are removed using an acceptable etching process. The etching process may include a wet etch process that comprises dilute hydrofluoric acid (dHF), ozone (03), ammonium hydroxide ($NH_4OH$), or the like which is performed to remove the top portions of the liner 118. In an embodiment, portions of the sidewalls and/or top surfaces of the first semiconductor fins 116A above the STI regions 124 are also etched during the etch process used to remove the top portions of the liner 118, such that the first semiconductor fins 116A have a first width W1 above a top surface of the STI regions 124. The first width W1 is smaller than a second width W2 of portions of the first semiconductor fins 116A below the STI regions 124. In an embodiment, at a location at which the portions of each first semiconductor fin 116A below the STI regions 124 and portions of the liner 118 below the STI regions 124 have the smallest combined width, a minimum fin width W3 (which may also be referred to as a minimum fin critical dimension (CD) W3) below the STI regions 124 may be equal to the sum of the width W2 of the first semiconductor fin 116A below a top surface of the STI regions 124 and the thicknesses T2 of the liner 118 on each sidewall of the first semiconductor fin 116A. The portions of the first semiconductor fins 116A below the STI regions 124 having a larger width W2 than portions of the first semiconductor fins 116A above the STI regions 124 allows for improved stability of the first semiconductor fins 116A and the ability to overcome potential fin bending or wobbling concerns. In addition, the width of the portions of the first semiconductor fins 116A above the STI regions 124 can be adjusted, allowing device performance to be tuned accordingly. In an embodiment, portions of the sidewalls and/or top surfaces of the second semiconductor fins 116B above the STI regions 124 are also etched during the etch process used to remove of the top portions of the liner 118, such that the second semiconductor fins 116B have a fourth width W4 above a top surface of the STI regions 124. The fourth width W4 is smaller than a fifth width W5 of portions of the second semiconductor fins 116B below the STI regions 124.

FIG. 12B shows a region 121 of FIG. 12A after the top portions of the liner 118 that are above the STI regions 124 are removed. Portions of the first semiconductor fin 116A in the first region 100A may protrude from between neighboring STI regions 124, and may comprise the second epitaxial layer 114. In an embodiment, top portions of the liner 118 are higher than topmost surfaces of the first epitaxial layer 106 and the n-well region 102. In an embodiment, top portions of the liner 118 are higher than a topmost point of the STI regions 124. In an embodiment, the topmost point of the STI regions 124 is at a level between a level of a topmost surface of the liner 118 and a level of a bottommost surface of the second epitaxial layer 114. In an embodiment, the topmost point of the STI regions 124 is in physical contact with the liner 118. In an embodiment, a height H2 of the STI regions 124 that are closer to a sidewall of the liner 118 is larger than a height H3 of the STI regions 124 that are further away from the sidewall of the liner 118. In an embodiment, a portion of the first semiconductor fin 116A that is above a topmost surface of the liner 118 may have a height H4 that is in a range from 35 nm to 65 nm. In an embodiment, at a location at which the portions of the first semiconductor fin 116A below the STI regions 124 and portions of the liner 118 below the STI regions 124 have the smallest combined width, the minimum fin width W3 (which may also be referred to as a minimum fin critical dimension (CD) W3) below the STI regions 124 may be equal to the sum of the width W2 of the first semiconductor fin 116A below a top surface of the STI regions 124 and the thicknesses T2 of the liner 118 on each sidewall of the first semiconductor fin 116A. Therefore the minimum fin width W3 includes the combined widths and thicknesses of the first semiconductor fin 116A below the top surface of the STI regions 124 (referring to width W2), the liner 118 on a first sidewall (referring to T2) of the first semiconductor fin 116A, and the liner 118 on a second sidewall (referring to T2) of the first semiconductor fin 116A. The minimum fin width W3 may be in a range from 6 nm to 15 nm. In an embodiment, the first semiconductor fin 116A may have the width W1 above a top surface of the STI regions 124. The portions of the first semiconductor fin 116A below the STI regions 124 and portions of the liner 118 below the STI regions 124 having a combined, minimum fin width W3 that is larger than the width W1 of portions of the first semiconductor fins 116A above the STI regions 124 allows for improved stability of the first semiconductor fins 116A and the ability to overcome potential fin bending or wobbling concerns. In addition, the width W1 of the portions of the first semiconductor fins 116A above the STI regions 124 can be adjusted using the etch process described above in FIG. 12A, allowing device performance to be tuned accordingly.

Figure 12C:
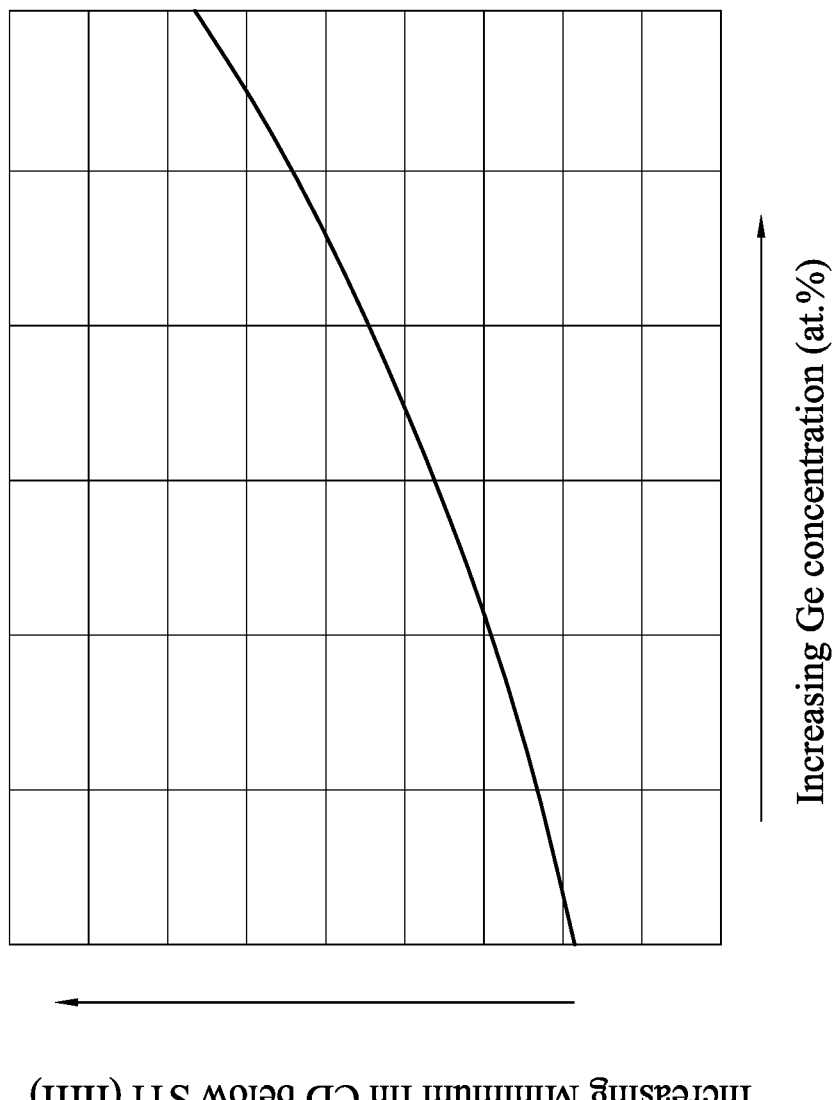

FIG. 12C shows a trace of the minimum fin width W3 versus germanium concentration of the second epitaxial layer 114. The minimum fin width W3 may also be referred to as the minimum fin critical dimension (CD) W3. The minimum fin width W3 is directly proportional on the germanium concentration of the second epitaxial layer 114, such that the minimum fin width W3 increases from 6 nm at an atomic germanium concentration of 20 percent to 15 nm at an atomic germanium concentration of 80 percent. In an embodiment, the value of the minimum fin width W3 can be calculated using the formula:

$$W3=(2*T1)-(2*(T1-T2))+W6$$

Where (2*(T1−T2)) is the thickness of the oxidized (consumed) liner 118, and W6 is the minimum fin width of the first semiconductor fin 116A to overcome fin bending or wiggle concerns. In an embodiment, the thickness of the oxidized (consumed) liner 118 (2*(T1−T2)) is about 1 nm and the minimum fin width W6 of the first semiconductor fin 116A to overcome fin bending or wiggle concerns is about 6 nm.

Advantages can be achieved as a result of the formation of the liner 118 over sidewalls and top surfaces of the first semiconductor fins 116A, wherein the minimum thickness T1 (e.g., which can be in a range from 0.5 nm to 5 nm) of the liner 118 is directly proportional to the atomic percentage concentration of germanium (e.g., which can be in a range from 20 percent to 80 percent) in the first semiconductor fins 116A. These advantages include the suppression of oxidation of the first semiconductor fins 116A during a subsequent anneal process performed on the dielectric material 120 that is formed over the first semiconductor fins 116A and the liner 118. This allows the first semiconductor fins 116A to be formed having a higher atomic percentage concentration of germanium without significant oxidation effects and having improved line end roughness (LER) of the first semiconductor fins 116A. Accordingly, device performance is improved due to the increase in carrier mobility as a result of the higher percentage concentration of germanium.

Figure 13A:
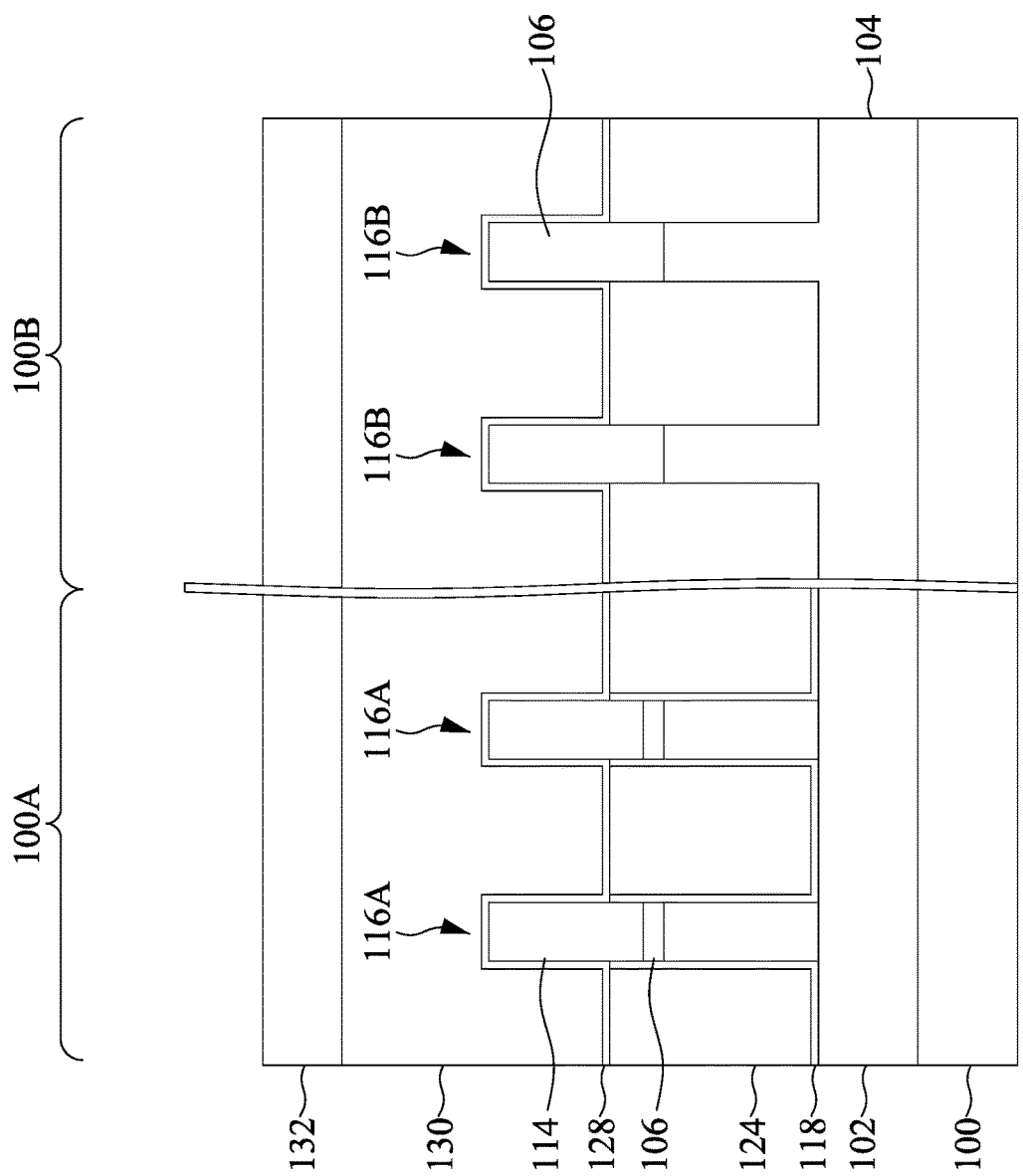
FIGS. 13A through 22B are cross-sectional views of intermediate stages in the manufacturing of FinFETs, in accordance with some embodiments.
Figure 13B:
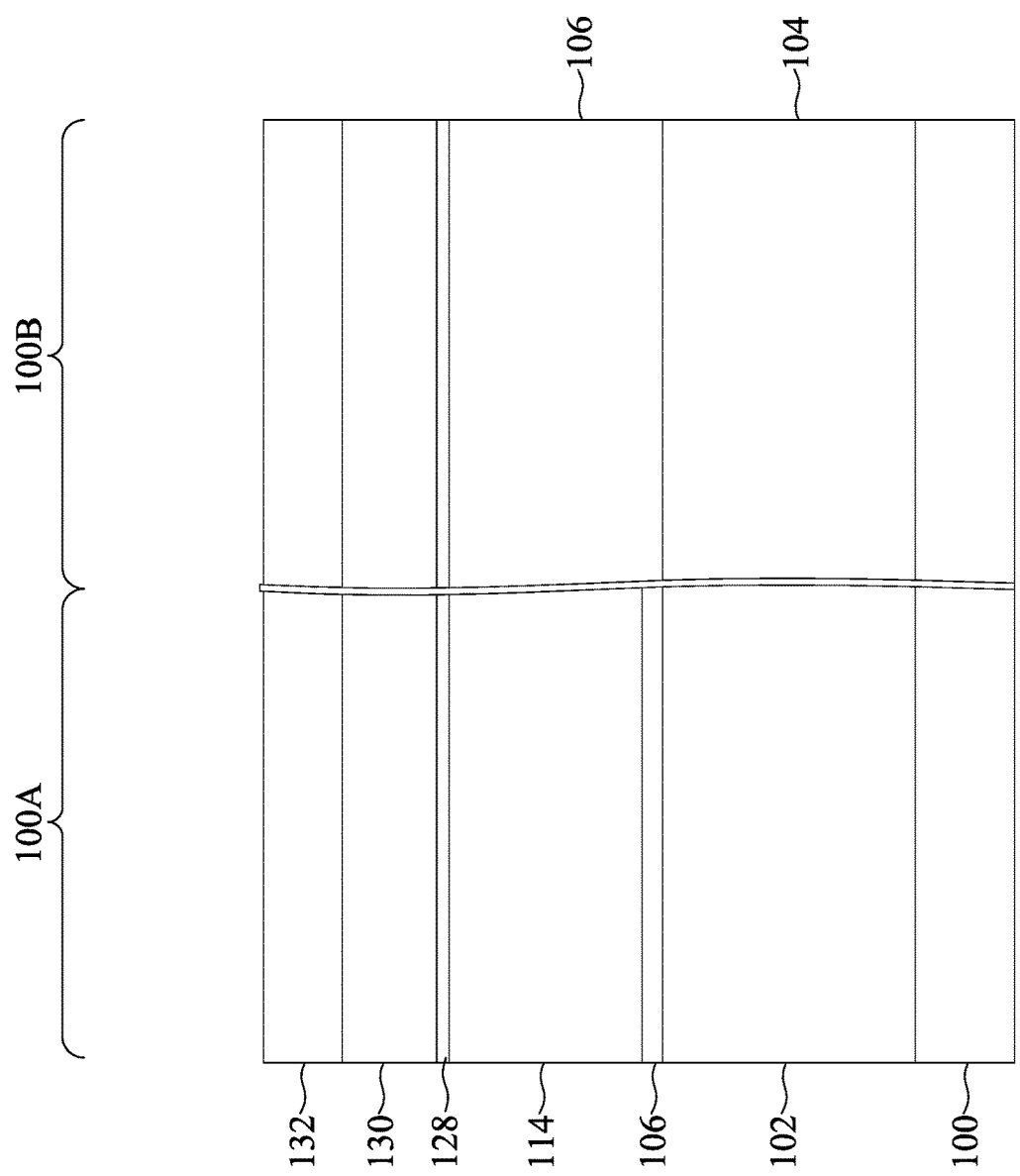

In FIGS. 13A and 13B, a dummy dielectric layer 128 is formed over the STI regions 124, and over top surfaces and sidewalls of the first semiconductor fins 116A and the second semiconductor fins 116B. The dummy dielectric layer 128 may be, for example, silicon oxide, silicon nitride, a combination thereof, or the like, and may be deposited by CVD, PVD, or the like. In an embodiment, the dummy dielectric layer 128 may be thermally grown according to acceptable techniques. A dummy gate layer 130 is formed over the dummy dielectric layer 128, and a mask layer 132 is formed over the dummy gate layer 130. The dummy gate layer 130 may be deposited over the dummy dielectric layer 128 and then planarized, such as by a CMP. The mask layer 132 may be deposited over the dummy gate layer 130. The dummy gate layer 130 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 130 may be deposited by physical vapor deposition (PVD), CVD, sputter deposition, or other techniques known and used in the art for depositing conductive materials. The mask layer 132 may include, for example, SiN, SiON, or the like, and may be deposited by PVD, CVD, or the like. In this example, a single dummy gate layer 130 and a single mask layer 132 are formed across the regions in which the first semiconductor fins 116A and the second semiconductor fins 116B are formed. In some embodiments, separate dummy gate layers 130 and separate mask layers 132 may be formed in the region in which the first semiconductor fins 116A are formed and the region in which the second semiconductor fins 116B are formed.

Figure 14A:
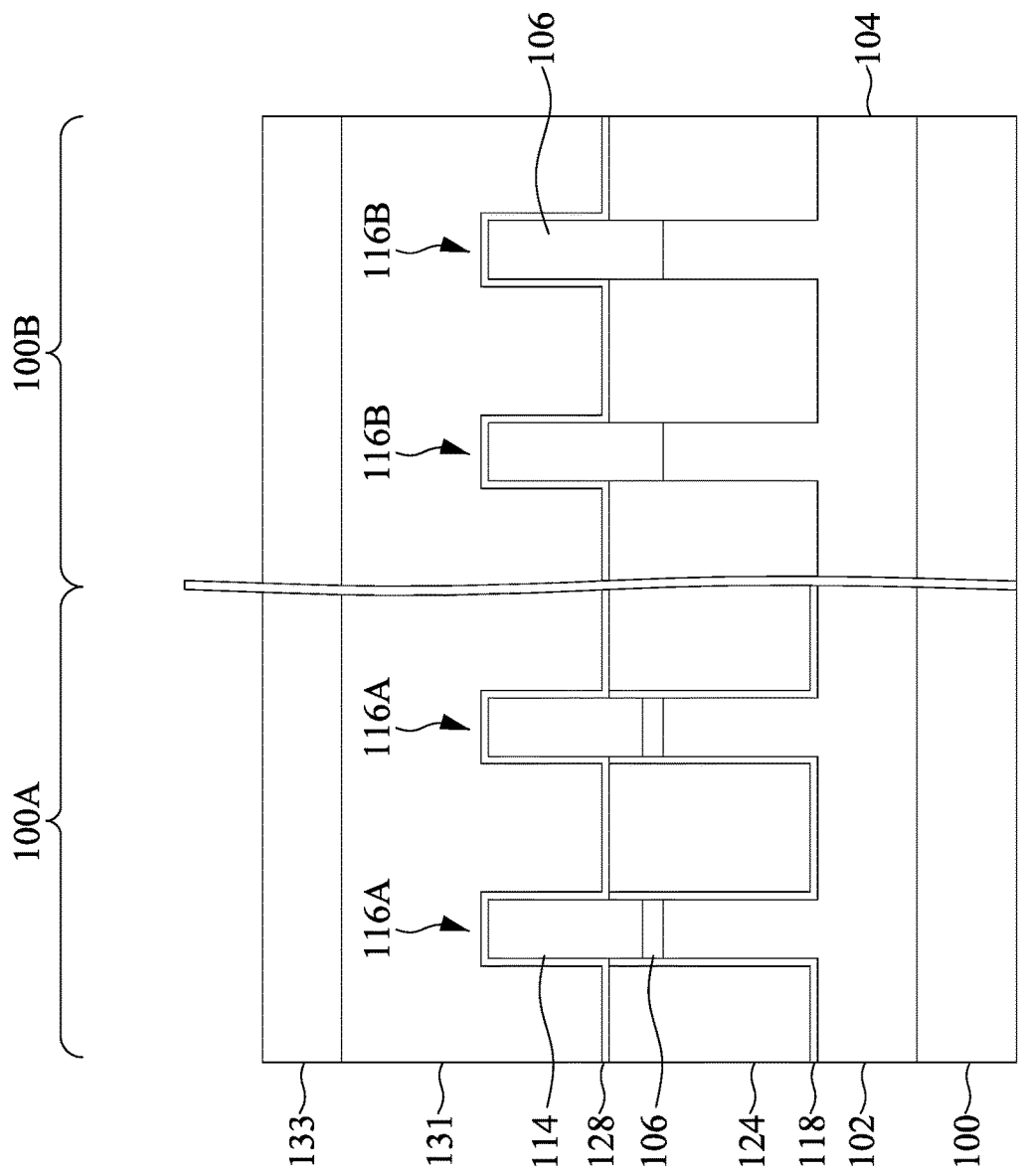
Figure 14B:
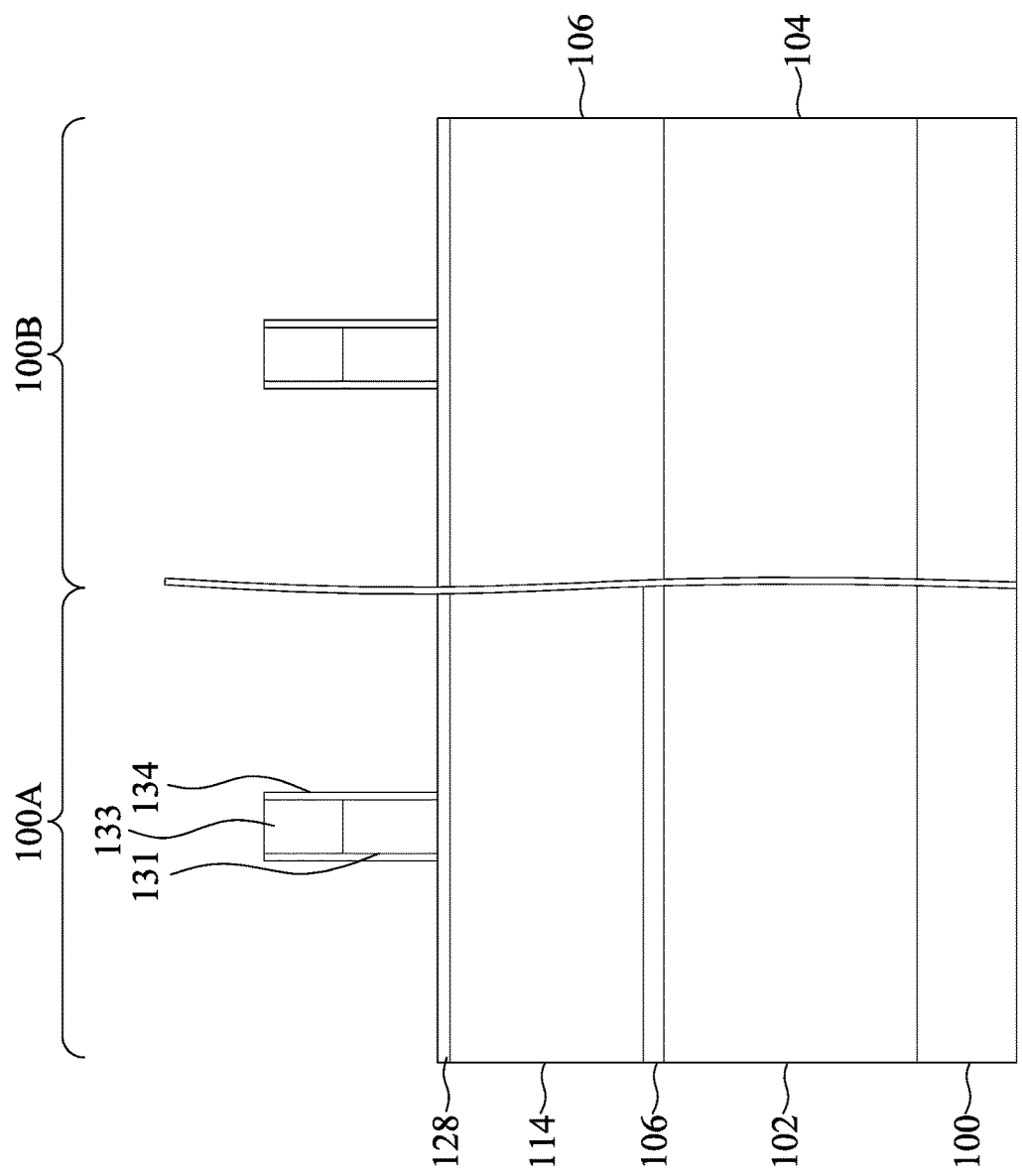

In FIGS. 14A and 14B, the mask layer 132 may be patterned using acceptable photolithography and etching techniques to form masks 133. The pattern of the masks 133 may be transferred to the dummy gate layer 130 by an acceptable etching technique to form dummy gates 131. In some embodiments, the pattern of the masks 133 may also be transferred to the dummy dielectric layer 128. The dummy gates 131 cover respective channel regions of the first semiconductor fins 116A and the second semiconductor fins 116B. The pattern of the masks 133 may be used to physically separate each of the dummy gates 131 from adjacent dummy gates 131. The dummy gates 131 may also have a lengthwise direction substantially perpendicular to the lengthwise direction of the first semiconductor fins 116A and the second semiconductor fins 116B.

As further illustrated in FIG. 14B, gate seal spacers 134 may be formed on exposed sidewalls of the dummy gates 131, the masks 133, and/or the first semiconductor fins 116A and the second semiconductor fins 116B. A thermal oxidation or a deposition followed by an anisotropic etch may be used to form the gate seal spacers 134. Although only one gate seal spacer 134 is illustrated in FIG. 14B, the gate seal spacers 134 may comprise a plurality of layers.

After the formation of the gate seal spacers 134, implants for lightly doped source/drain (LDD) regions (not explicitly illustrated) may be performed. In the embodiments with different device types, a mask, such as a photoresist, may be formed over the first region 100A, while exposing the second region 100B, and appropriate type (e.g., n-type) impurities may be implanted into the exposed second semiconductor fins 116B in the second region 100B. The mask may then be removed. Subsequently, a mask, such as a photoresist, may be formed over the second region 100B while exposing the first region 100A, and appropriate type (e.g., p-type) impurities may be implanted into the exposed first semiconductor fins 116A in the first region 100A. The mask may then be removed. The n-type impurities may be phosphorus, arsenic, or the like, and the p-type impurities may be boron, $BF_2$, or the like. The lightly doped source/drain regions may have a concentration of impurities of from about $10^{15}$ cm$^{-3}$ to about $10^{16}$ cm$^{-3}$. An anneal may be used to activate the implanted impurities.

Figure 15A:
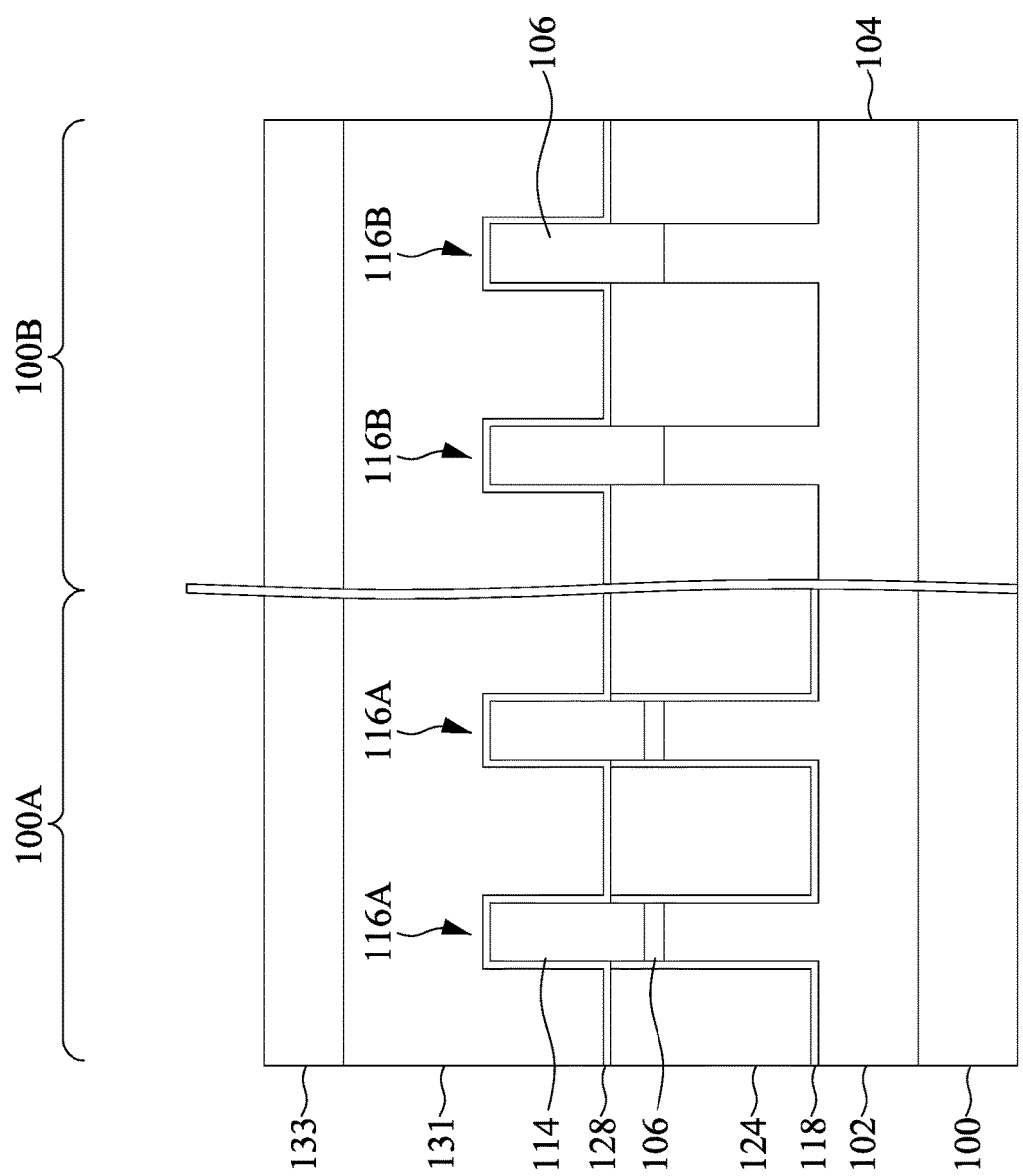
Figure 15B:
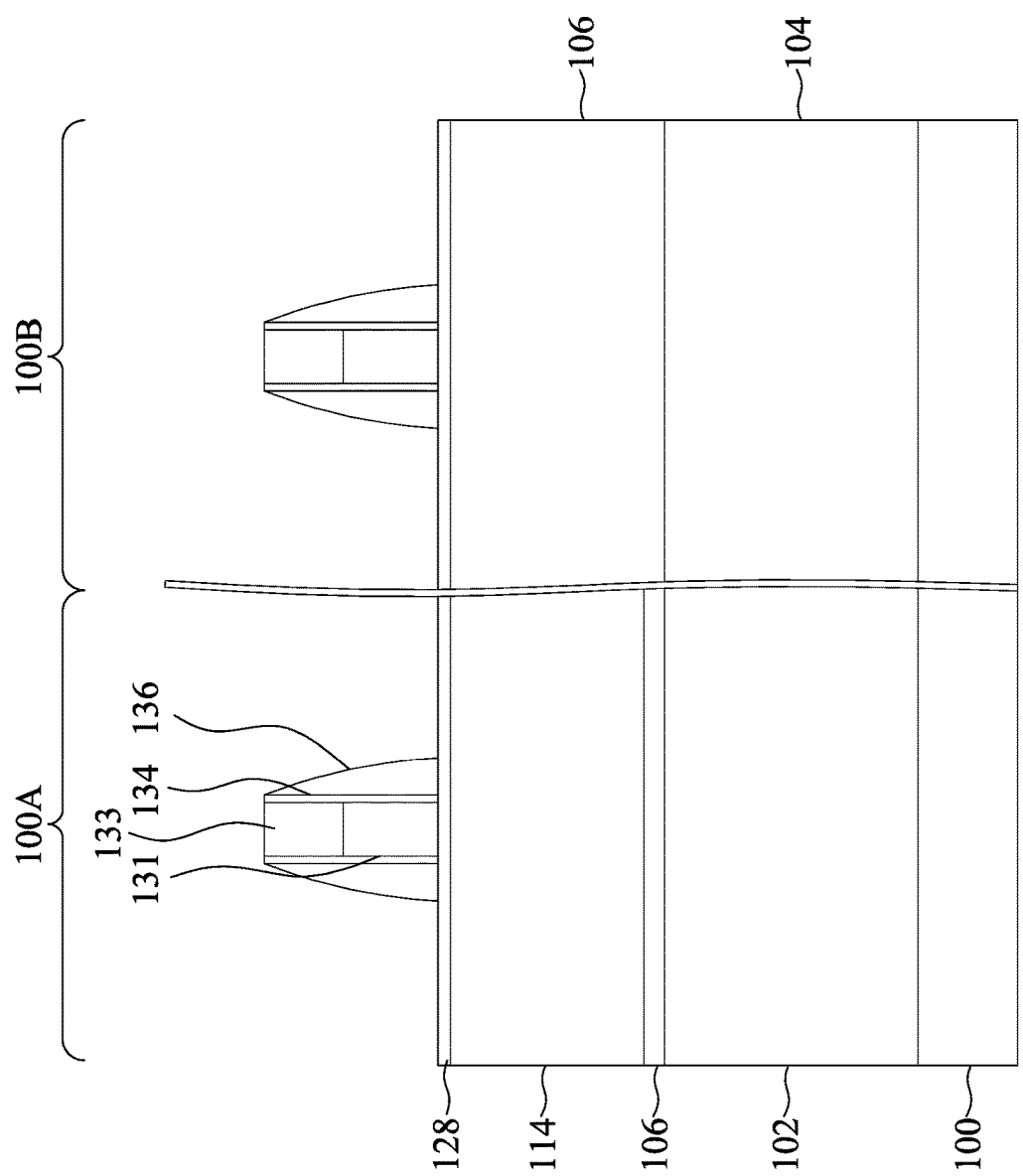

In FIGS. 15A and 15B, gate spacers 136 are formed on the gate seal spacers 134 along sidewalls of the dummy gates 131 and the masks 133. The gate spacers 136 may be formed by conformally depositing a material and subsequently anisotropically etching the material. The material of the gate spacers 136 may be silicon nitride, SiCN, a combination thereof, or the like. The gate spacers 136 may comprise a single layer or multiple layers.

In FIGS. 16A through 16D epitaxial source/drain regions 138 are formed in the first semiconductor fins 116A and the second semiconductor fins 116B. The epitaxial source/drain regions 138 are formed in the first semiconductor fins 116A and the second semiconductor fins 116B such that each dummy gate 131 is disposed between respective neighboring pairs of the epitaxial source/drain regions 138. In some embodiments, the epitaxial source/drain regions 138 may extend into the first semiconductor fins 116A and the second semiconductor fins 116B. In some embodiments, the gate spacers 136 are used to separate the epitaxial source/drain regions 138 from the dummy gates 131 by an appropriate lateral distance so that the epitaxial source/drain regions 138 do not short out subsequently formed gates of the resulting FinFETs.

The epitaxial source/drain regions 138 in the first region 100A (e.g., the PMOS region) may be formed by masking the second region 100B (e.g., the NMOS region) and etching source/drain regions of the first semiconductor fins 116A in the first region 100A to form recesses in the first semiconductor fins 116A. Then, the epitaxial source/drain regions 138 in the first region 100A are epitaxially grown in the recesses. In some embodiments, the epitaxial source/drain regions 138 may extend through the second epitaxial layer 114 and the first epitaxial layer 106 into the n-well region 102 in the first region 100A. The epitaxial source/drain regions 138 may include any acceptable material appropriate for p-type FinFETs. For example, the epitaxial source/drain regions 138 in the first region 100A may include SiGe, SiGeB, Ge, GeSn, or the like. The epitaxial source/drain regions 138 in the first region 100A may be formed of a material having a greater lattice constant than the lattice constant of the second epitaxial layer 114, creating a compressive stress in the channel region to increase hole mobility for PMOS devices. The epitaxial source/drain regions 138 in the first region 100A may have surfaces raised from respective surfaces of the first semiconductor fins 116A and may have facets.

The epitaxial source/drain regions 138 in the second region 100B (e.g., the NMOS region) may be formed by masking the first region 100A (e.g., the PMOS region) and etching source/drain regions of the second semiconductor fins 116B in the second region 100B to form recesses in the second semiconductor fins 116B. Then, the epitaxial source/drain regions 138 in the second region 100B are epitaxially grown in the recesses. The epitaxial source/drain regions 138 may include any acceptable material, such as appropriate for n-type FinFETs. For example, the epitaxial source/drain regions 138 in the second region 100B may include silicon, SiC, SiCP, SiP, or the like. The epitaxial source/drain regions 138 in the second region 100B may be formed of a material having a smaller lattice constant than the lattice constant of the first epitaxial layer 106, creating a tensile stress in the channel region to increase electron mobility for NMOS devices. The epitaxial source/drain regions 138 in the second region 100B may also have surfaces raised from respective surfaces of the second semiconductor fins 116B and may have facets.

The epitaxial source/drain regions 138 and/or the first semiconductor fins 116A and the second semiconductor fins 116B may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 138 may be in situ doped during growth.

As a result of the epitaxy processes used to form the epitaxial source/drain regions 138 in the first region 100A and the second region 100B, upper surfaces of the epitaxial source/drain regions 138 have facets which expand laterally outward beyond a sidewalls of the first semiconductor fins 116A and the second semiconductor fins 116B. In some embodiments, these facets cause adjacent source/drain regions 138 in the first semiconductor fins 116A to merge as illustrated by FIG. 16C. In other embodiments, adjacent source/drain regions 138 in the first semiconductor fins 116A remain separated after the epitaxy process is completed as illustrated by FIG. 16D. Similarly, adjacent source/drain regions 138 in the second semiconductor fins 116B may be merged or remain separated after the epitaxy process is completed.

Figure 16A:
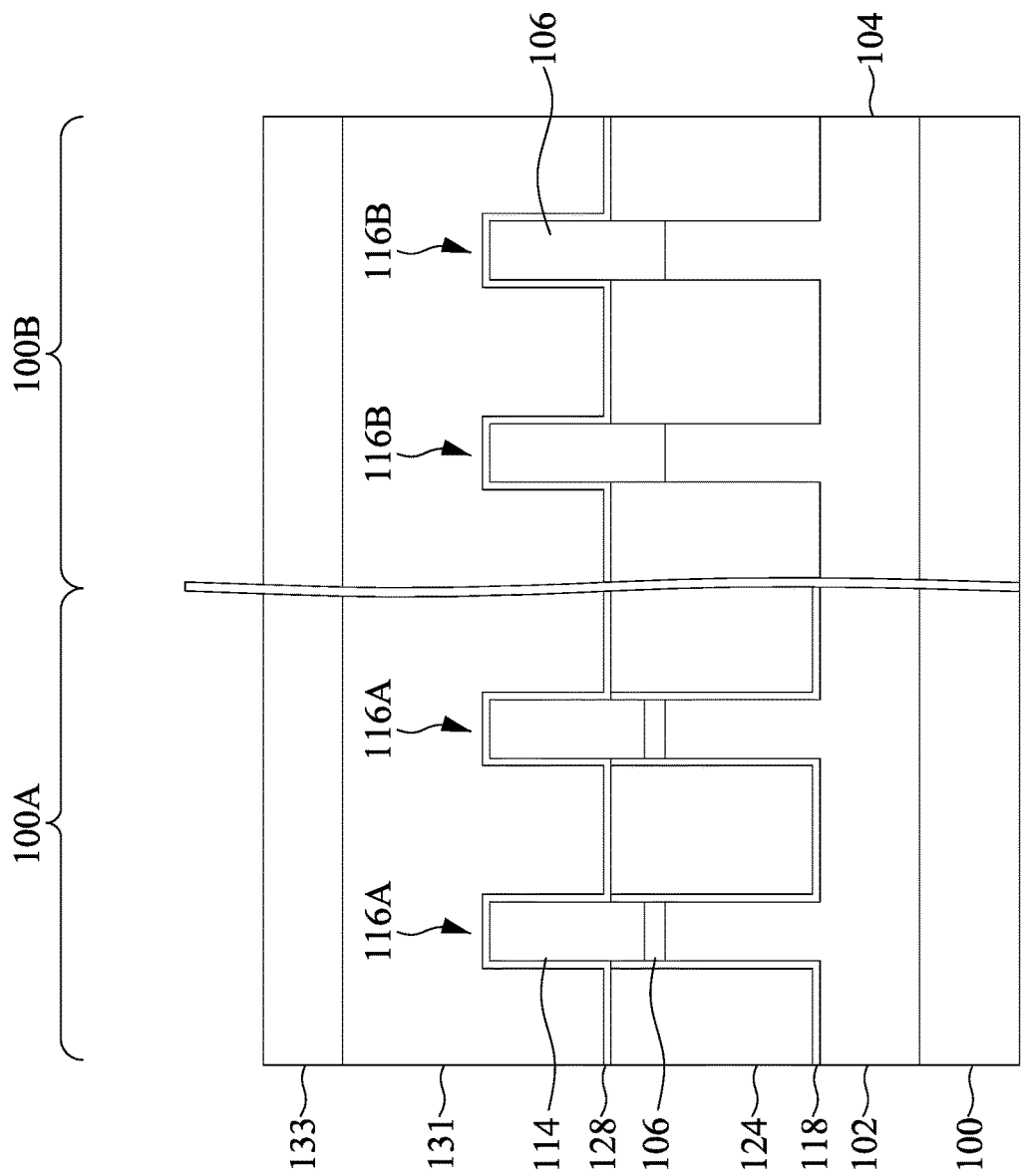
Figure 16B:
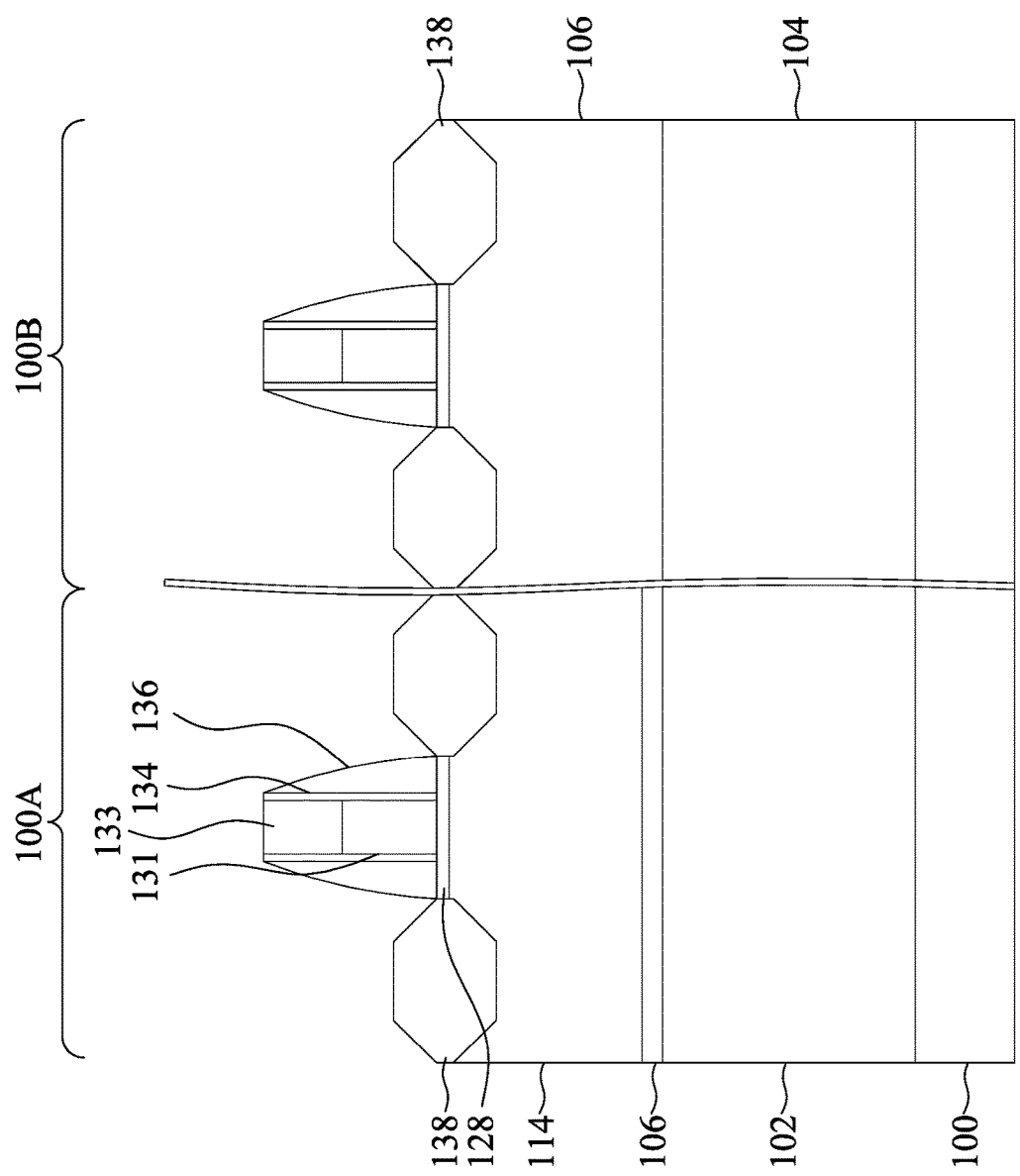
Figure 16C:
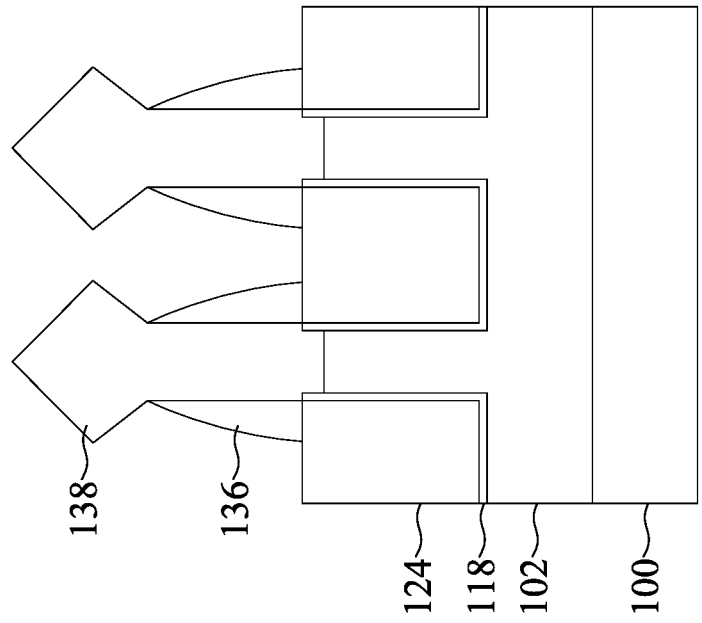
Figure 16D:
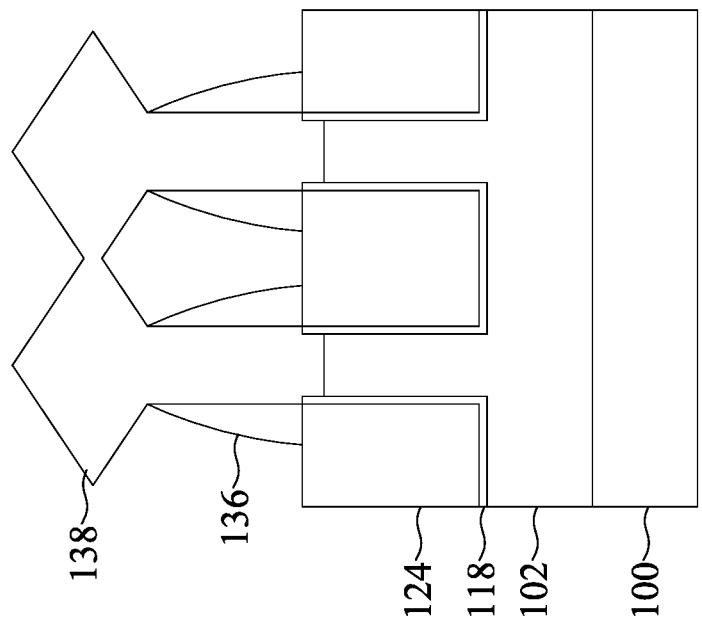
Figure 17A:
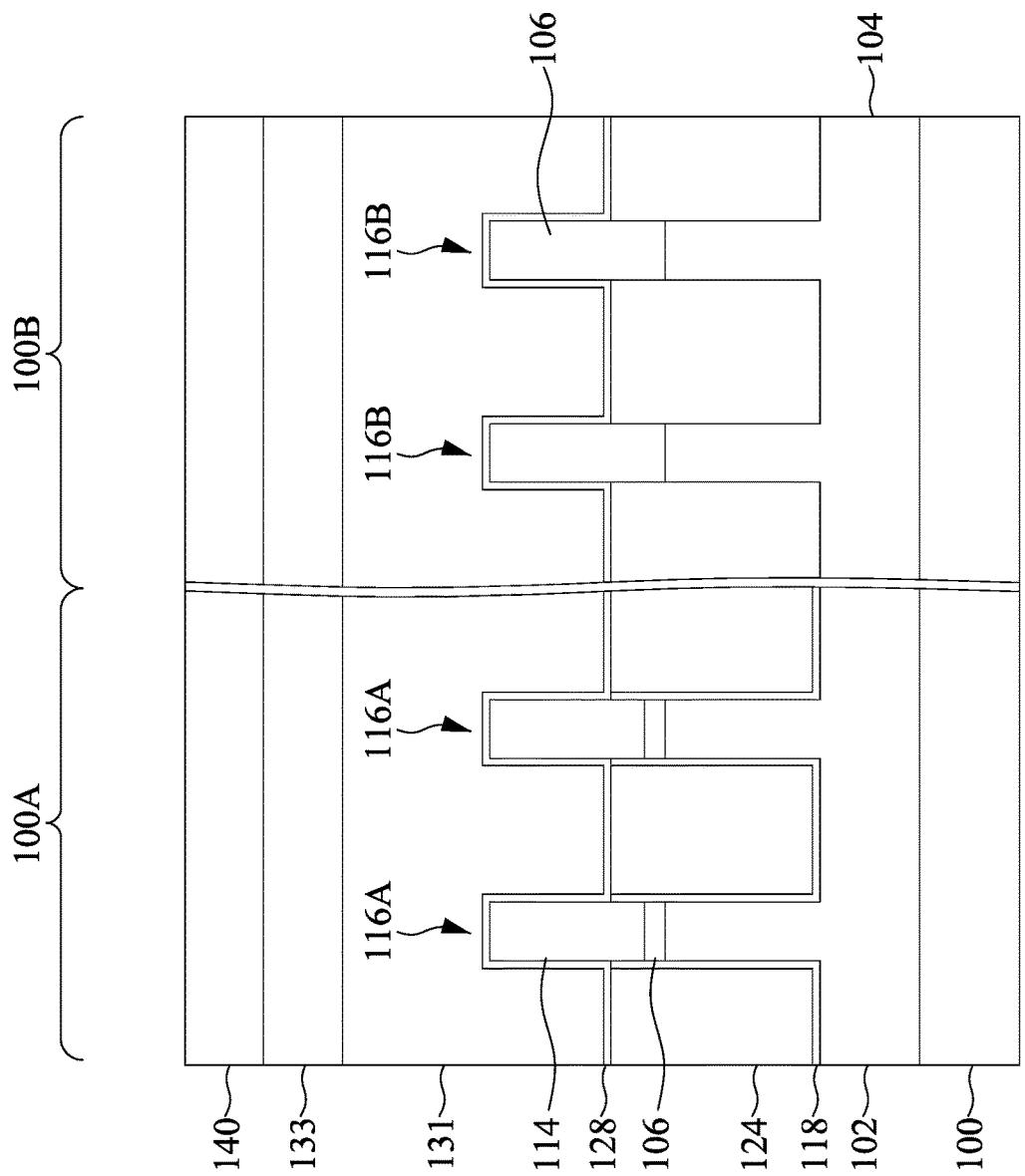
Figure 17B:
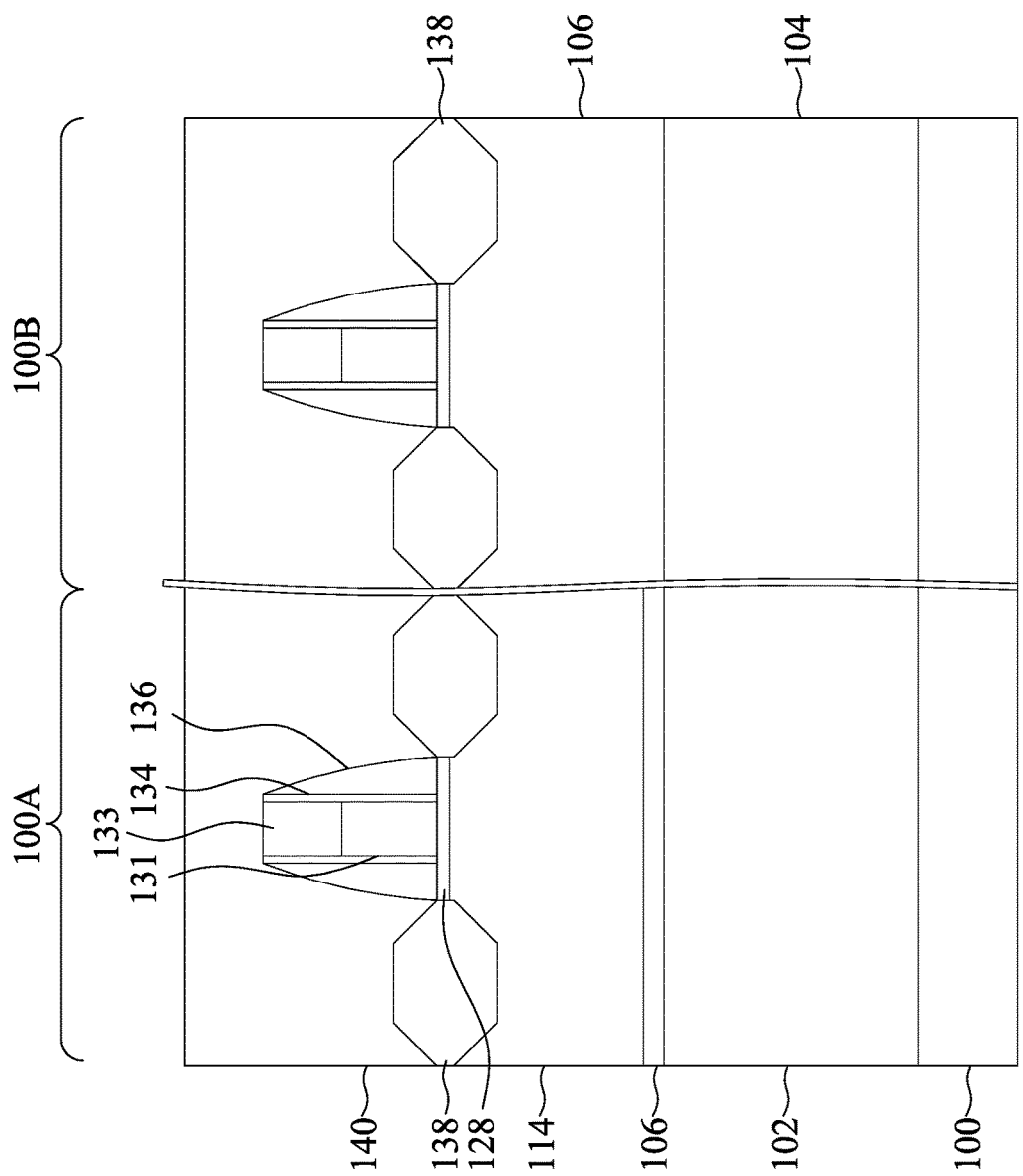

In FIGS. 17A and 17B, a first interlayer dielectric (ILD) 140 is deposited over the structure illustrated in FIGS. 16A and 16B. The first ILD 140 may be formed of a dielectric material or a semiconductor material, and may be deposited by any suitable method, such as CVD, plasma-enhanced CVD (PECVD), or flowable CVD (FCVD). Dielectric materials may include phosphosilicate glass (PSG), borosilicate glass (BSG), boron-doped phosphosilicate glass (BPSG), undoped silicate glass (USG), or the like. Semiconductor materials may include amorphous silicon (a-Si), silicon germanium ($Si_xGe_{1-x}$, where x may be between approximately 0 and 1), pure germanium, or the like. Other insulation or semiconductor materials formed by any acceptable process may be used. In some embodiments, a contact etch stop layer (CESL, not separately illustrated), is disposed between the first ILD 140 and the epitaxial source/drain regions 138, the masks 133, and the gate spacers 136.

Figure 18A:
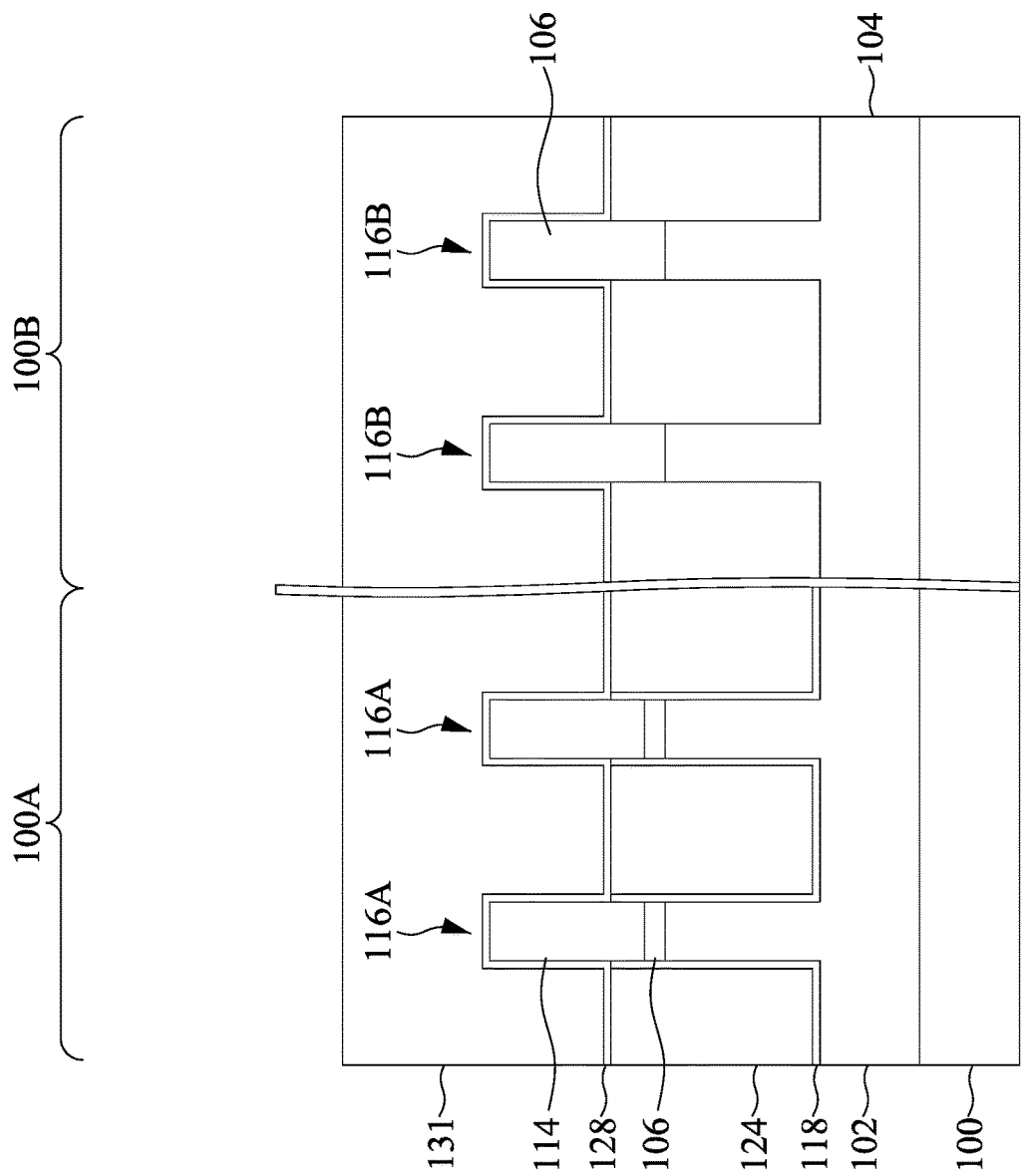
Figure 18B:
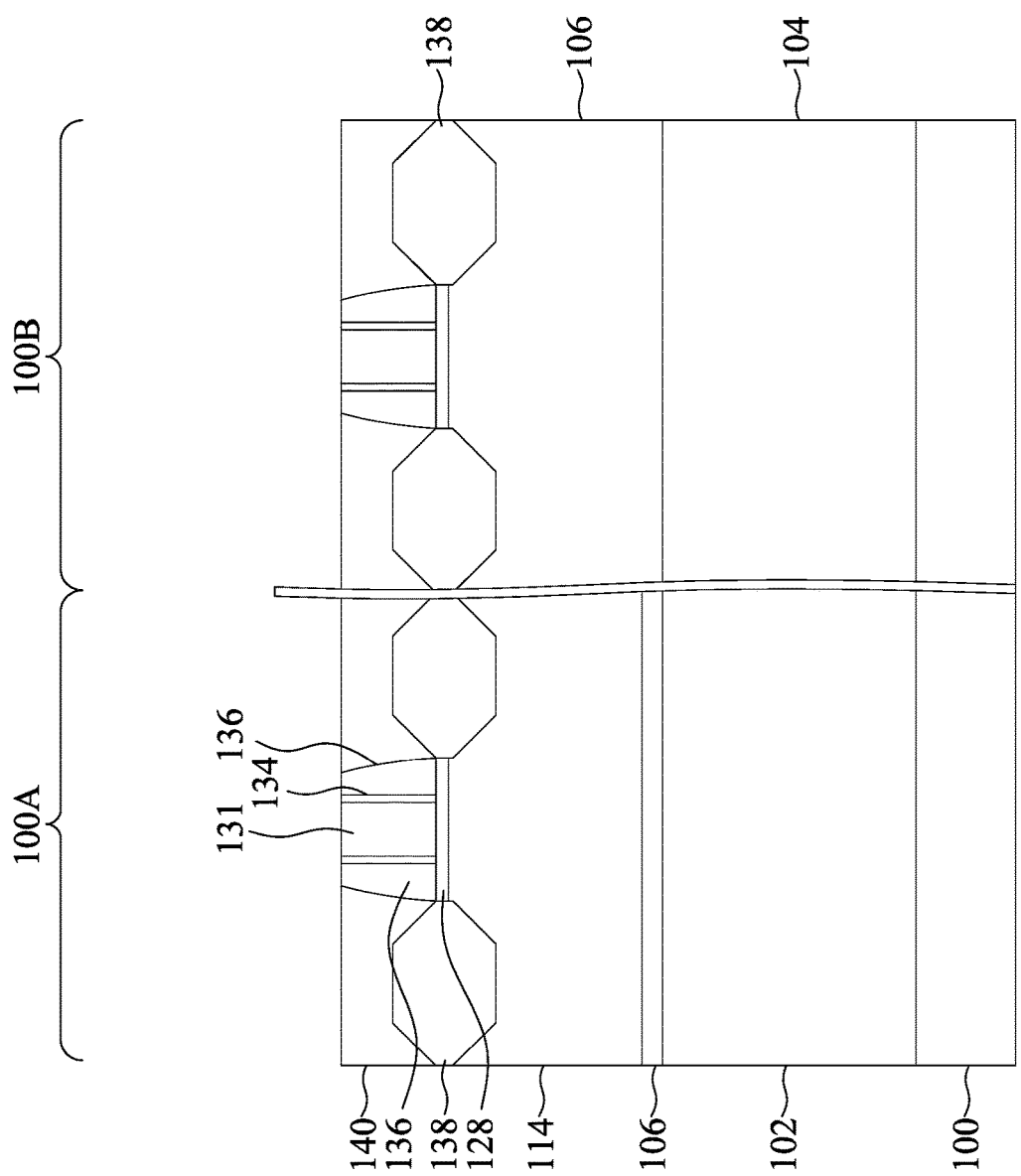

In FIGS. 18A and 18B, a planarization process, such as a CMP, may be performed to level the top surface of the first ILD 140 with the top surfaces of the dummy gates 131. The planarization process may also remove the masks 133 on the dummy gates 131, and portions of the gate seal spacers 134 and the gate spacers 136 along sidewalls of the masks 133. After the planarization process, top surfaces of the dummy gates 131, the gate seal spacers 134, the gate spacers 136, and the first ILD 140 are level. Accordingly, the top surfaces of the dummy gates 131 are exposed through the first ILD 140.

Figure 19A:
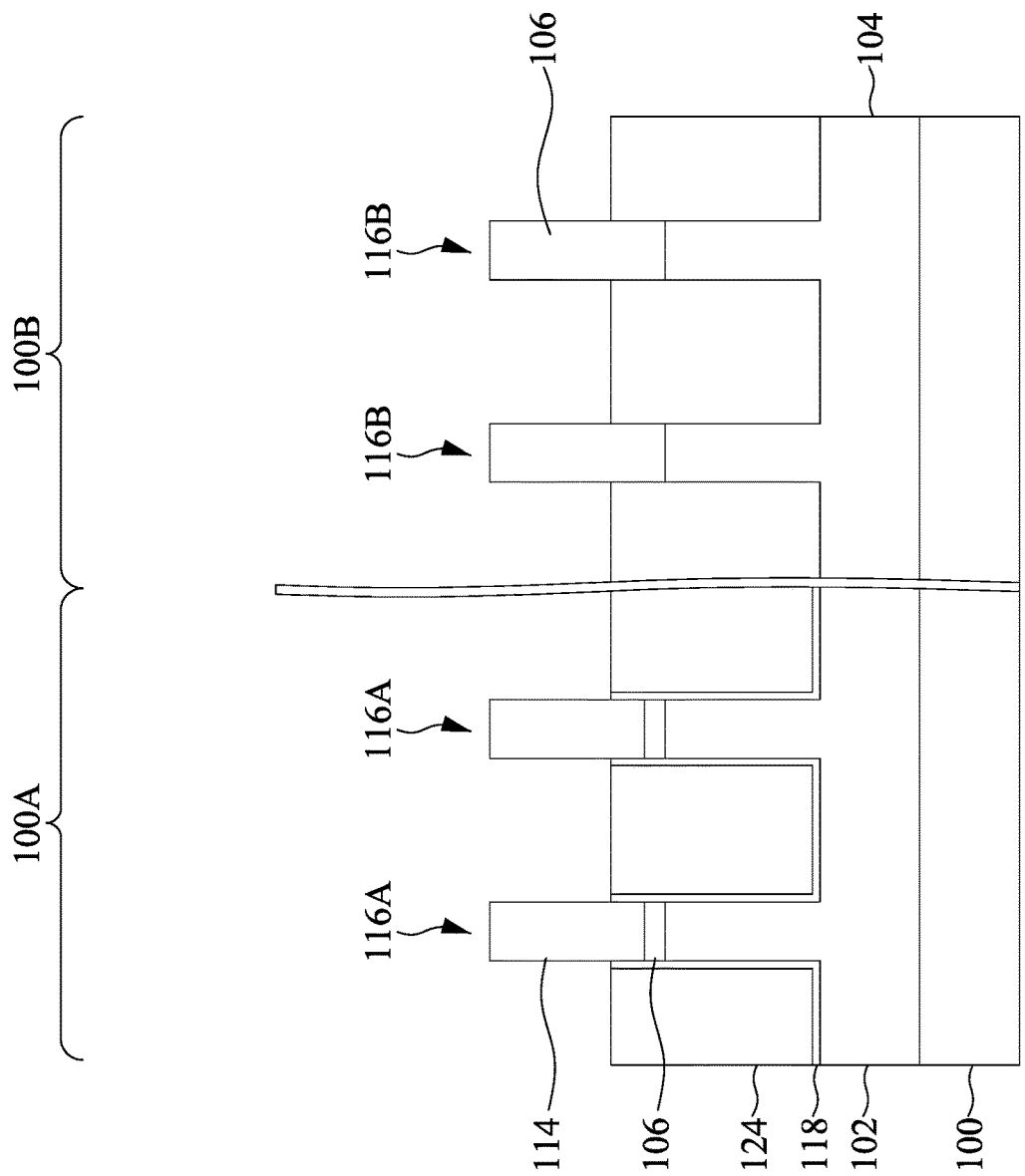
Figure 19B:
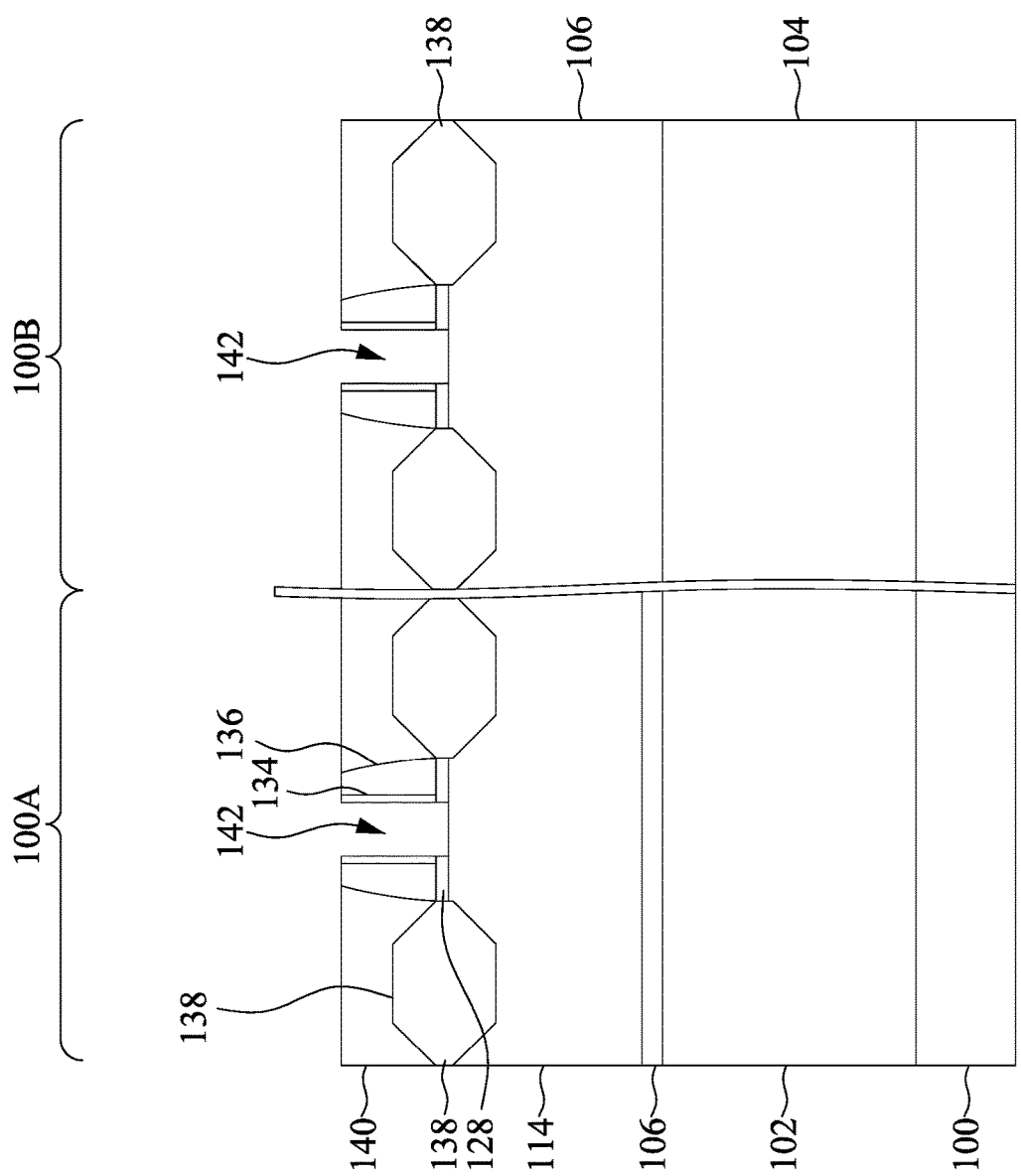

In FIGS. 19A and 19B, the dummy gates 131 and portions of the dummy dielectric layer 128 directly underlying the dummy gates 131 are removed in an etching step(s), so that recesses 142 are formed. In some embodiments, the dummy gates 131 are removed by an anisotropic dry etch process. For example, the etching process may include a dry etch process using reaction gas(es) that selectively etch the dummy gates 131 without etching the first ILD 140 or the gate spacers 136. Each recess 142 exposes a channel region of a respective first semiconductor fin 116A or second semiconductor fin 116B. Each channel region is disposed between neighboring pairs of the epitaxial source/drain regions 138. During the removal, the dummy dielectric layer 128 may be used as an etch stop layer when the dummy gates 131 are etched. The dummy dielectric layer 128 may then be removed after the removal of the dummy gates 131.

Figure 20A:
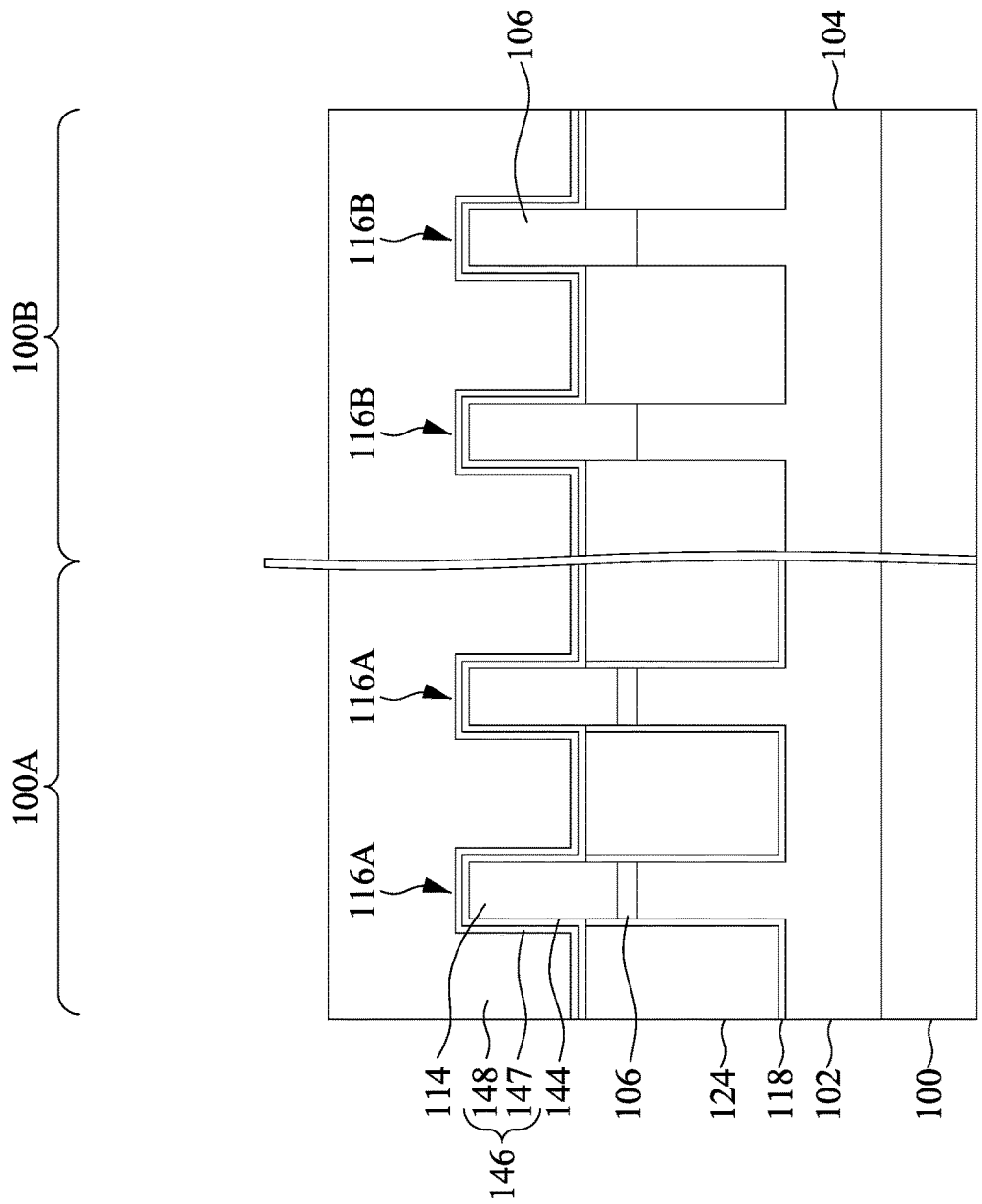
Figure 20B:
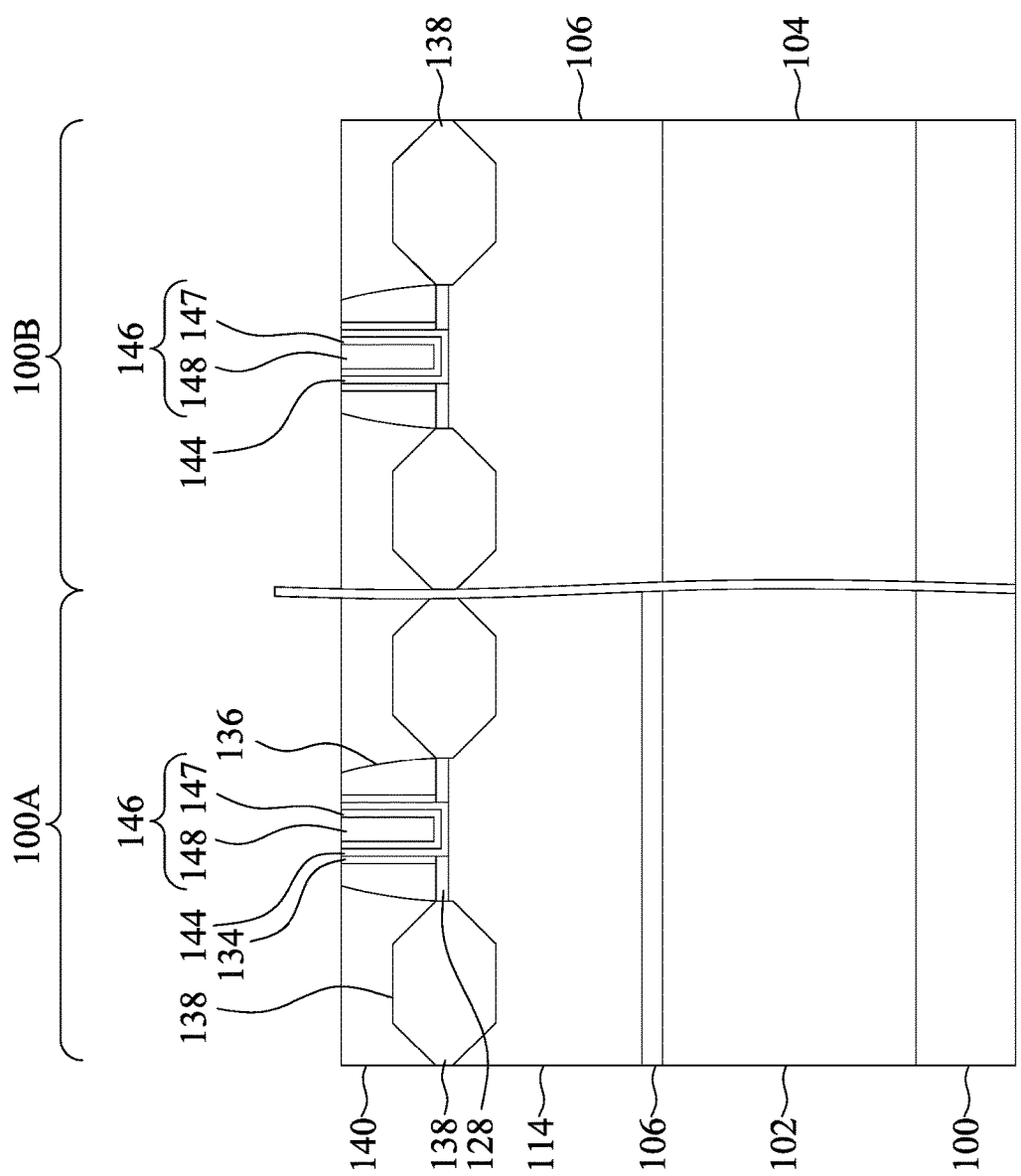

In FIGS. 20A and 20B, gate dielectric layers 144 and gate electrodes 146 are formed for replacement gates. The gate dielectric layers 144 are deposited conformally in the recesses 142, such as on the top surfaces and the sidewalls of the first semiconductor fins 116A and the second semiconductor fins 116B and on sidewalls of the gate seal spacers 134/gate spacers 136. The gate dielectric layers 144 may also be formed on the top surface of the first ILD 140. In accordance with some embodiments, the gate dielectric layers 144 comprise silicon oxide, silicon nitride, or multilayers thereof. In some embodiments, the gate dielectric layers 144 are a high-k dielectric material, and in these embodiments, the gate dielectric layers 144 may have a k value greater than about 7.0, and may include a metal oxide or a silicate of Hf, Al, Zr, La, Mg, Ba, Ti, Pb, and combinations thereof. The formation methods of the gate dielectric layers 144 may include molecular beam deposition (MBD), ALD, PECVD, and the like.

The gate electrodes 146 are deposited over the gate dielectric layers 144 and fill the remaining portions of the recesses 142. The gate electrodes 146 may be a metal-containing material such as TiN, TaN, TaC, Co, Ru, Al, combinations thereof, or multi-layers thereof. The gate electrodes 146 may include one or more layers of conductive material, such as a work function layer 147 and a fill material 148. After the filling of the gate electrodes 146, a planarization process, such as a CMP, may be performed to remove the excess portions of the gate dielectric layers 144 and the gate electrodes 146, which excess portions are over the top surface of the first ILD 140. The remaining portions of the gate electrodes 146 and the gate dielectric layers 144 thus form replacement gates of the resulting FinFETs. The gate electrodes 146 and the gate dielectric layers 144 may be collectively referred to as a "gate" or a "gate stack." The gate and the gate stacks may extend along sidewalls of a channel region of the first semiconductor fins 116A and the second semiconductor fins 116B.

The formation of the gate dielectric layers 144 in the first region 100A and the second region 100B may occur simultaneously such that the gate dielectric layers 144 in each region are formed from the same materials, and the formation of the gate electrodes 146 may occur simultaneously such that the gate electrodes 146 in each region are formed from the same materials. In some embodiments, the gate dielectric layers 144 in each region may be formed by distinct processes, such that the gate dielectric layers 144 may be different materials, and/or the gate electrodes 146 in each region may be formed by distinct processes, such that the gate electrodes 146 may be different materials. Various masking steps may be used to mask and expose appropriate regions when using distinct processes.

Figure 21A:
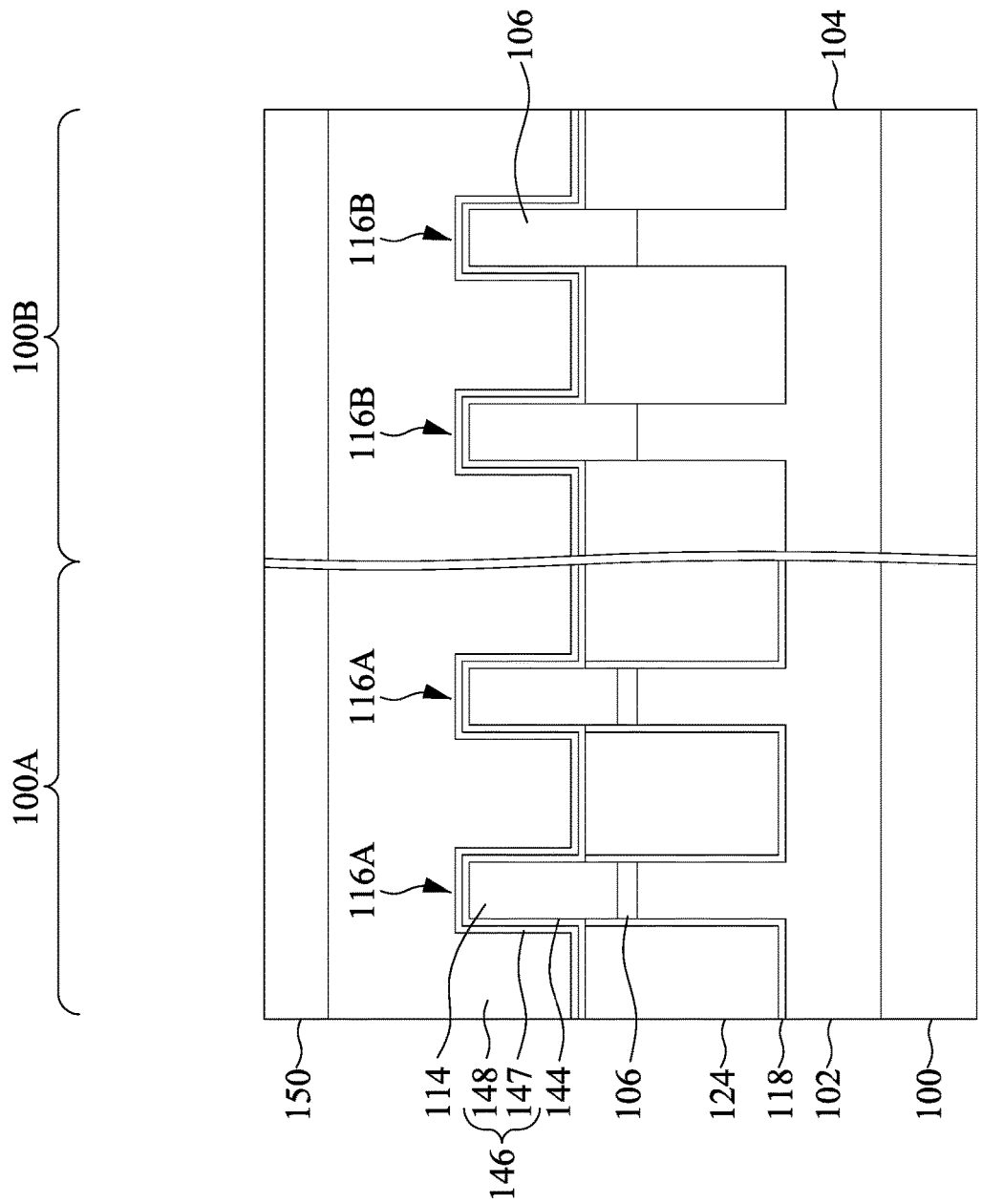
Figure 21B:
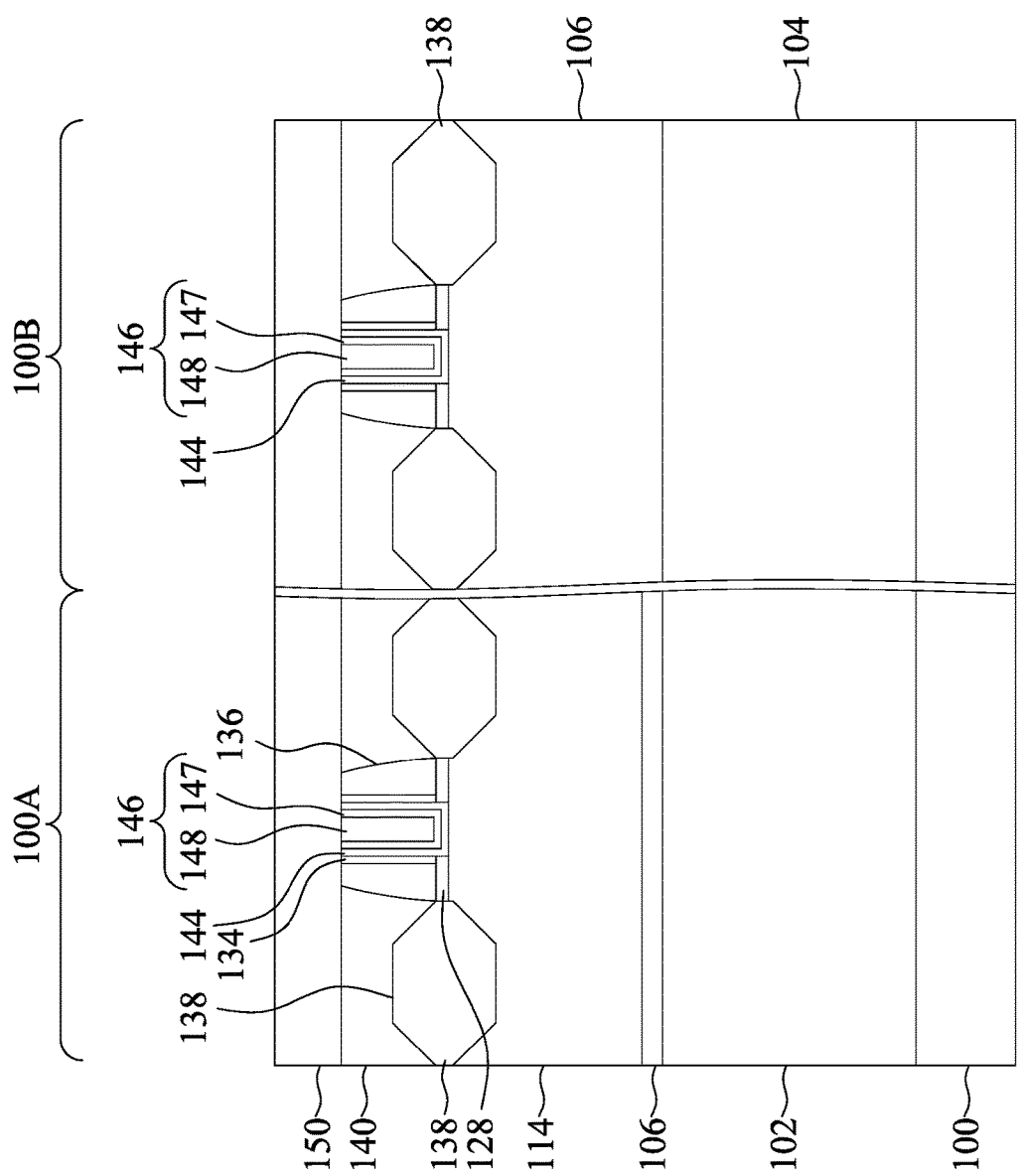

In FIGS. 21A and 21B, a second ILD 150 is deposited over the first ILD 140. In an embodiment, the second ILD 150 is a flowable film formed by a flowable CVD method. In some embodiments, the second ILD 150 is formed of a dielectric material such as PSG, BSG, BPSG, USG, or the like, and may be deposited by any suitable method, such as CVD and PECVD.

Figure 22A:
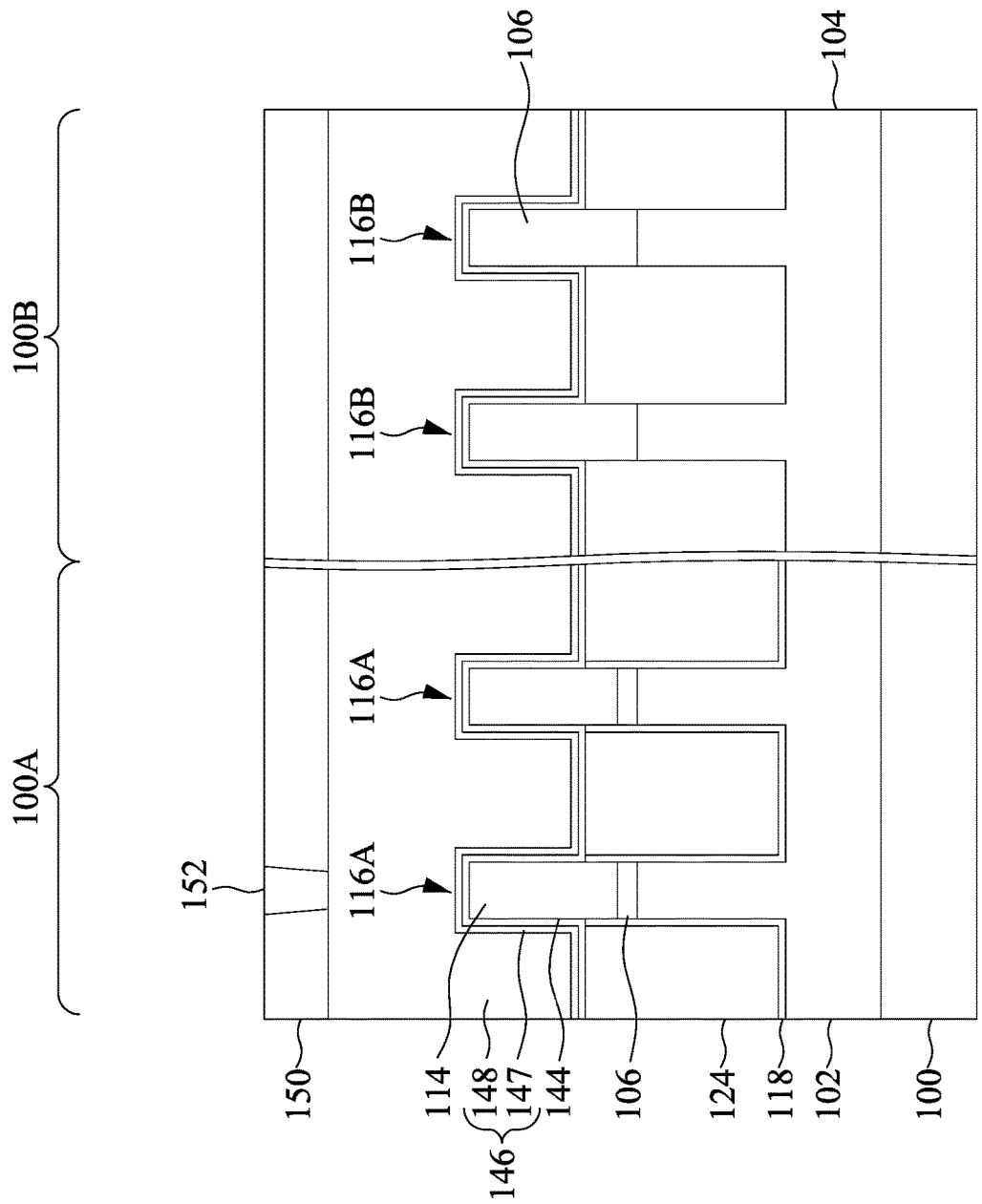
Figure 22B:
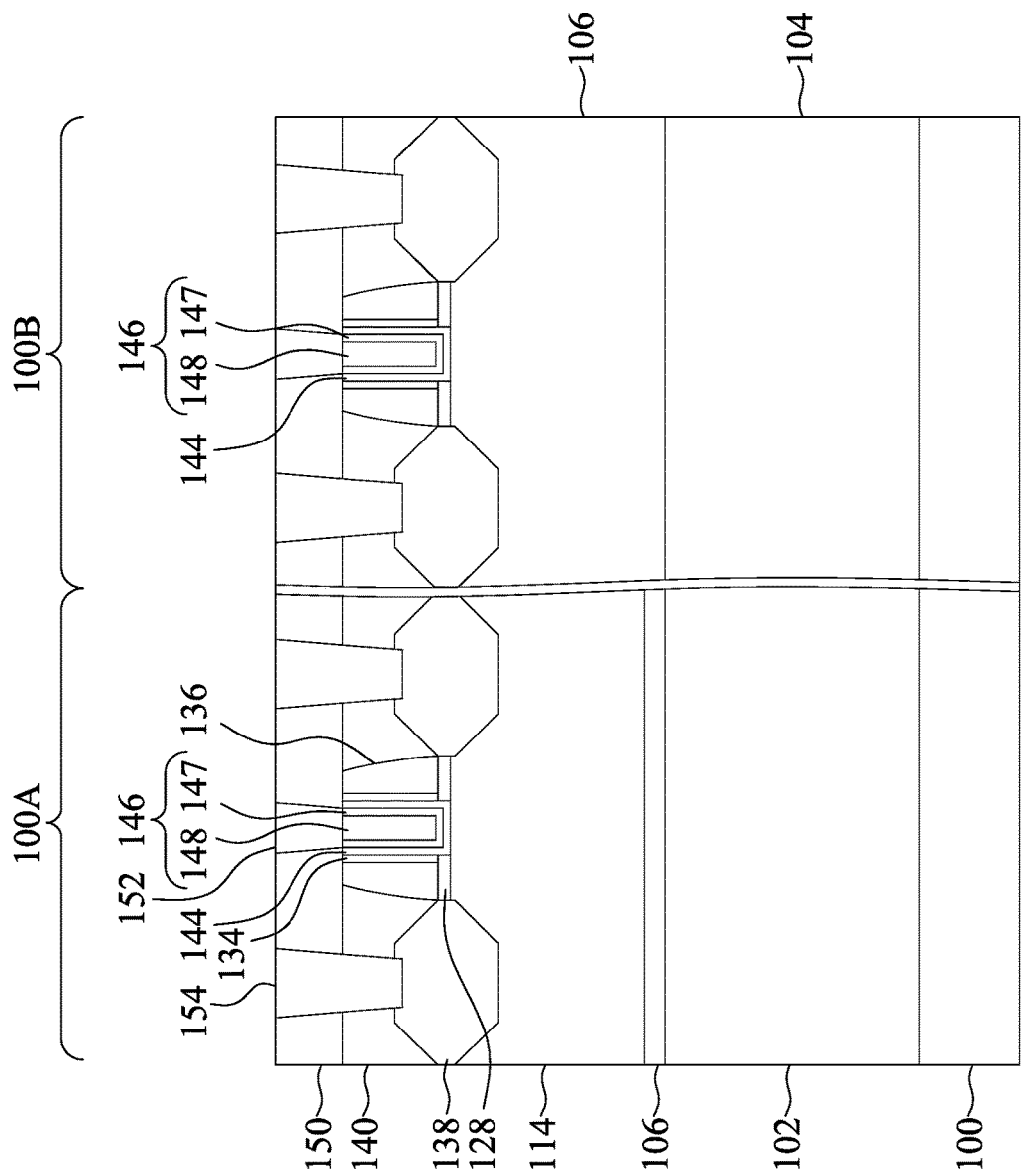

In FIGS. 22A and 22B, a gate contact 152 and source/drain contacts 154 are formed through the second ILD 150 and the first ILD 140. Openings for the source/drain contacts 154 (not separately illustrated) are formed through the second ILD 150 and the first ILD 140, and openings for the gate contact 152 (not separately illustrated) are formed through the second ILD 150. The openings may be formed using acceptable photolithography and etching techniques. Optionally, prior to formation of the gate contact 152 and the source/drain contacts 154, a silicide contact (not separately illustrated) may be formed. The silicide contact may comprise titanium, nickel, cobalt, or erbium, and may be used to reduce the Schottky barrier height of the gate contact 152 and the source/drain contacts 154. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process.

The gate contact 152 and the source/drain contacts 154 may be formed of conductive materials such as Al, Cu, W, Co, Ti, Ta, Ru, TiN, TiAl, TiAlN, TaN, TaC, NiSi, CoSi, combinations of these, or the like, although any suitable material may be used. The material of the gate contact 152 and the source/drain contacts 154 may be deposited into the openings in the second ILD 150 and the first ILD 140 using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP).

The gate contact 152 is physically and electrically connected to the gate electrode 148, and the source/drain contacts 154 are physically and electrically connected to the epitaxial source/drain regions 138. FIGS. 22A and 22B illustrate the gate contact 152 and the source/drain contacts 154 in a same cross-section; however, in other embodiments, the gate contact 152 and the source/drain contacts 154 may be disposed in different cross-sections. Further, the position of the gate contact 152 and the source/drain contacts 154 in FIGS. 22A and 22B are merely illustrative and not intended to be limiting in any way. For example, the gate contact 152 may be vertically aligned with one of the first semiconductor fins 116A as illustrated or may be disposed at a different location on the gate electrode 148. Furthermore, the source/drain contacts 154 may be formed prior to, simultaneously with, or after forming the gate contacts 152.

The embodiments of the present disclosure have some advantageous features. The embodiments include the formation of a silicon liner over sidewalls and a top surface of a semiconductor fin, followed by the forming of insulation material over the semiconductor fin and the silicon liner. The semiconductor fin is formed at least partially of silicon germanium. An anneal process is then performed on the insulation material, and the insulation material is then recessed to form shallow trench isolation (STI) regions that surround the semiconductor fin. The minimum thickness of the silicon liner is directly proportional to the atomic percentage concentration of germanium in the semiconductor fin. One or more embodiments disclosed herein may include the suppression of oxidation of the semiconductor fin during the anneal process. This allows the semiconductor fin to be formed having a higher atomic percentage concentration of germanium without significant oxidation effects and improved line end roughness (LER) of the semiconductor fin. Accordingly, device performance is improved due to the increase in carrier mobility as a result of the higher percentage concentration of germanium.

In accordance with an embodiment, a method includes forming a fin extending from a substrate; depositing a liner over a top surface and sidewalls of the fin, where a minimum thickness of the liner is selected according to a first germanium concentration of the fin; forming a shallow trench isolation (STI) region adjacent the fin; removing a first portion of the liner on the sidewalls of the fin, the first portion of the liner being above a topmost surface of the STI region; and forming a gate stack on sidewalls and a top surface of the fin, where the gate stack is in physical contact with the liner. In an embodiment, the fin includes silicon germanium. In an embodiment, the liner includes silicon, and where the liner includes a first thickness in a range from 0.5 nm to 5 nm. In an embodiment, depositing the liner takes place at a process temperature in a range from 350° C. to 500° C. and a process pressure in a range from 0.5 mtorr to 3 mtorr. In an embodiment, the method further includes etching portions of the fin that are above the topmost surface of the STI region. In an embodiment, the fin includes a first portion above the topmost surface of the STI, and a second portion below the topmost surface of the STI region, where the first portion includes silicon germanium and the second portion includes silicon. In an embodiment, a topmost point of the STI region is at a level between a level of a topmost surface of the liner and a level of a bottommost surface of the first portion of the fin.

In accordance with an embodiment, a method includes patterning a substrate such that a semiconductor fin protrudes from a major surface of the substrate, where the semiconductor fin includes a first portion and a second portion below the first portion, where a first material of the first portion of the semiconductor fin is different from a second material of the second portion of the semiconductor fin; depositing a semiconductor liner over the substrate, along the first portion of the semiconductor fin, and along the second portion of the semiconductor fin; depositing a dielectric material over the semiconductor liner, the substrate, and the semiconductor fin; recessing the dielectric material to form a shallow trench isolation (STI) region adjacent the semiconductor fin, where after the recessing the first portion of the semiconductor fin protrudes above a top surface of the STI region; and etching the semiconductor liner from sidewalls of the first portion of the semiconductor fin. In an embodiment, the first material is silicon germanium and the second material is silicon. In an embodiment, the second portion of the semiconductor fin extends below the top surface of the STI region. In an embodiment, depositing the semiconductor liner includes depositing a silicon layer that has a minimum thickness that is in a range from 0.5 nm to 5 nm at the thinnest point of the silicon layer in a cross-sectional view. In an embodiment, the minimum thickness is selected according to a first germanium concentration of the first portion of the semiconductor fin. In an embodiment, the first germanium concentration of the first portion of the semiconductor fin is in a range from 20 atomic percent to 80 atomic percent. In an embodiment, a first height of the STI region that is closer to a sidewall of the semiconductor liner is larger than a second height of the STI region that is further away from the sidewall of the semiconductor liner.

In accordance with an embodiment, a device includes a semiconductor fin extending from a substrate, the semiconductor fin including a first portion; and a second portion below the first portion, where the first portion includes silicon germanium, and the second portion includes silicon; a semiconductor liner on sidewalls of the second portion of the semiconductor fin; and a shallow trench isolation (STI) region adjacent the semiconductor fin, where a topmost point of the STI region is at a level that is between a level of a topmost surface of the semiconductor liner and a level of a bottommost surface of the first portion of the semiconductor fin. In an embodiment, a germanium concentration of the first portion of the semiconductor fin is in a range from 20 atomic percent to 80 atomic percent. In an embodiment, a sum of a first width of the second portion of the semiconductor fin, a second width of the semiconductor liner on a first sidewall of the second portion of the semiconductor fin, and a third width of the semiconductor liner on a second sidewall of the second portion of the semiconductor fin is in a range from 6 nm to 15 nm. In an embodiment, the first width of the second portion of the semiconductor fin is larger than a fourth width of the first portion of the semiconductor fin. In an embodiment, the semiconductor liner includes silicon. In an embodiment, the topmost point of the STI region and a bottommost surface of the STI region are in physical contact with the semiconductor liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin extending from a substrate;
   depositing a liner over a top surface and sidewalls of the fin, wherein a minimum thickness of the liner is selected according to a first germanium concentration of the fin;
   forming a shallow trench isolation (STI) region adjacent the fin, wherein the fin comprises a first portion above a topmost surface of the STI region, and a second portion below the topmost surface of the STI region, wherein the first portion comprises silicon germanium and the second portion comprises silicon;
   removing a first portion of the liner on the sidewalls of the fin, the first portion of the liner being above the topmost surface of the STI region; and
   forming a gate stack on sidewalls and a top surface of the fin, wherein the gate stack is in physical contact with the liner.

2. The method of claim 1, wherein the liner comprises silicon, and wherein the liner comprises a first thickness in a range from 0.5 nm to 5 nm.

3. The method of claim 1, wherein depositing the liner takes place at a process temperature in a range from 350° C. to 500° C. and a process pressure in a range from 0.5 mtorr to 3 mtorr.

4. The method of claim 1, further comprising etching sidewalls of the first portion of the fin.

5. The method of claim 1, wherein a topmost point of the STI region is at a level between a level of a topmost surface of the liner and a level of a bottommost surface of the first portion of the fin.

6. The method of claim 1, wherein the first portion of the fin has a first width that is smaller than a second width of the second portion of the fin.

7. The method of claim 1, wherein removing the first portion of the liner on the sidewalls of the fin comprises performing a wet etching process using ozone ($O_3$) as an etchant.

8. A method comprising:
   patterning a substrate such that a semiconductor fin protrudes from a major surface of the substrate, wherein the semiconductor fin comprises a first portion and a second portion below the first portion, wherein a first material of the first portion of the semiconductor fin is different from a second material of the second portion of the semiconductor fin, wherein the first material comprises silicon germanium having a first germanium concentration that is in a range from 20 atomic percent to 80 atomic percent;
   depositing a semiconductor liner over the substrate, along the first portion of the semiconductor fin, and along the second portion of the semiconductor fin;
   depositing a dielectric material over the semiconductor liner, the substrate, and the semiconductor fin;
   recessing the dielectric material to form a shallow trench isolation (STI) region adjacent the semiconductor fin, wherein after the recessing the first portion of the semiconductor fin protrudes above a top surface of the STI region; and etching the semiconductor liner from sidewalls of the first portion of the semiconductor fin.

9. The method of claim 8, wherein the second material is silicon.

10. The method of claim 8, wherein the second portion of the semiconductor fin extends below the top surface of the STI region.

11. The method of claim 8, wherein depositing the semiconductor liner comprises depositing a silicon layer that has a minimum thickness that is in a range from 0.5 nm to 5 nm at the thinnest point of the silicon layer in a cross-sectional view.

12. The method of claim 11, wherein the minimum thickness is selected according to the first germanium concentration of the first portion of the semiconductor fin.

13. The method of claim 8, wherein a first height of the STI region that is closer to a sidewall of the semiconductor liner is larger than a second height of the STI region that is further away from the sidewall of the semiconductor liner.

14. The method of claim 8, wherein after etching the semiconductor liner from the sidewalls of the first portion of the semiconductor fin, the first portion of the semiconductor fin has a first width that is different from a second width of the second portion of the semiconductor fin.

15. The method of claim 14, wherein the first width of the first portion of the semiconductor fin is smaller than the second width of the second portion of the semiconductor fin.

16. A device comprising:
a semiconductor fin extending from a substrate, the semiconductor fin comprising:
a first portion; and
a second portion below the first portion, wherein the first portion comprises silicon germanium, and the second portion comprises silicon, wherein a germanium concentration of the first portion of the semiconductor fin is in a range from 20 atomic percent to 80 atomic percent;
a semiconductor liner on sidewalls of the second portion of the semiconductor fin; and
a shallow trench isolation (STI) region adjacent the semiconductor fin, wherein a topmost point of the STI region is at a level that is between a level of a topmost surface of the semiconductor liner and a level of a bottommost surface of the first portion of the semiconductor fin.

17. The device of claim 15, wherein a sum of a first width of the second portion of the semiconductor fin, a second width of the semiconductor liner on a first sidewall of the second portion of the semiconductor fin, and a third width of the semiconductor liner on a second sidewall of the second portion of the semiconductor fin is in a range from 6 nm to 15 nm.

18. The device of claim 17, wherein the first width of the second portion of the semiconductor fin is larger than a fourth width of the first portion of the semiconductor fin.

19. The device of claim 15, wherein the semiconductor liner comprises silicon.

20. The device of claim 15, wherein the topmost point of the STI region and a bottommost surface of the STI region are in physical contact with the semiconductor liner.

* * * * *